(12) United States Patent
Huang et al.

(10) Patent No.: US 10,411,020 B2
(45) Date of Patent: Sep. 10, 2019

(54) USING THREE OR MORE MASKS TO DEFINE CONTACT-LINE-BLOCKING COMPONENTS IN FINFET SRAM FABRICATION

(71) Applicant: Taiwan Semiconductor Manufacturing Co., Ltd., Hsinchu (TW)

(72) Inventors: Shih-Han Huang, Hsinchu (TW); Chih-Hung Hsieh, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/691,868

(22) Filed: Aug. 31, 2017

(65) Prior Publication Data
US 2019/0067299 A1 Feb. 28, 2019

(51) Int. Cl.
| | |
|---|---|
| *H01L 27/11* | (2006.01) |
| *H01L 21/02* | (2006.01) |
| *H01L 21/265* | (2006.01) |
| *H01L 21/311* | (2006.01) |
| *H01L 21/768* | (2006.01) |
| *H01L 21/8238* | (2006.01) |
| *H01L 27/092* | (2006.01) |

(52) U.S. Cl.
CPC .... *H01L 27/1104* (2013.01); *H01L 21/02532* (2013.01); *H01L 21/26513* (2013.01); *H01L 21/31144* (2013.01); *H01L 21/76802* (2013.01); *H01L 21/76877* (2013.01); *H01L 21/823821* (2013.01); *H01L 21/823828* (2013.01); *H01L 21/823871* (2013.01); *H01L 27/0924* (2013.01)

(58) Field of Classification Search
CPC ........... H01L 27/1104; H01L 21/02532; H01L 21/26513
See application file for complete search history.

(56) References Cited

U.S. PATENT DOCUMENTS

| | | | |
|---|---|---|---|
| 7,378,710 B2 | 5/2008 | Breitwisch et al. |
| 8,134,183 B2 | 3/2012 | Becker et al. |
| 8,399,931 B2 | 3/2013 | Liaw et al. |
| 8,605,523 B2 | 12/2013 | Tao et al. |
| 8,630,132 B2 | 1/2014 | Cheng et al. |

(Continued)

FOREIGN PATENT DOCUMENTS

| | | |
|---|---|---|
| DE | 102015104604 A1 | 10/2015 |
| DE | 112012001220 B4 | 12/2016 |

(Continued)

*Primary Examiner* — Errol V Fernandes
(74) *Attorney, Agent, or Firm* — Haynes and Boone, LLP

(57) ABSTRACT

A plurality of gate stacks is formed over a substrate. The gate stacks are surrounded by a dielectric structure. A plurality of contact-line-blocking patterns is formed over the dielectric structure. The contact-line-blocking patterns are formed using three or more lithography masks. A plurality of trenches is formed in the dielectric structure. The contact-line-blocking patterns serve as protective masks for the dielectric structure to prevent trenches from being formed in portions of the dielectric structure underneath the contact-line-blocking patterns. The trenches are filled with a conductive material to form a plurality of contact lines of the SRAM device.

20 Claims, 22 Drawing Sheets

(56) References Cited

U.S. PATENT DOCUMENTS

| | | | |
|---|---|---|---|
| 8,760,948 | B2 | 6/2014 | Tao et al. |
| 9,041,117 | B2 | 5/2015 | Liaw |
| 9,236,300 | B2 | 1/2016 | Liaw |
| 2013/0258759 | A1 | 10/2013 | Liaw |
| 2014/0032871 | A1 | 1/2014 | Hsu et al. |
| 2014/0131813 | A1 | 5/2014 | Liaw |
| 2014/0153321 | A1 | 6/2014 | Liaw |
| 2014/0153345 | A1 | 6/2014 | Kim et al. |
| 2014/0177352 | A1 | 6/2014 | Lum |
| 2014/0233330 | A1 | 8/2014 | Ko et al. |
| 2014/0241077 | A1 | 8/2014 | Katoch et al. |
| 2014/0269114 | A1 | 9/2014 | Yang et al. |
| 2016/0093626 | A1* | 3/2016 | Izumi ............... H01L 21/76805 257/324 |
| 2016/0314972 | A1 | 10/2016 | Huang et al. |

FOREIGN PATENT DOCUMENTS

| | | |
|---|---|---|
| KR | 20140001578 | 1/2014 |
| KR | 20140070306 | 6/2014 |
| KR | 20170026049 | 3/2017 |
| KR | 20170065423 | 6/2017 |
| TW | 201342535 A | 10/2013 |
| TW | 201517125 A | 5/2015 |
| TW | I567874 A | 1/2017 |

\* cited by examiner

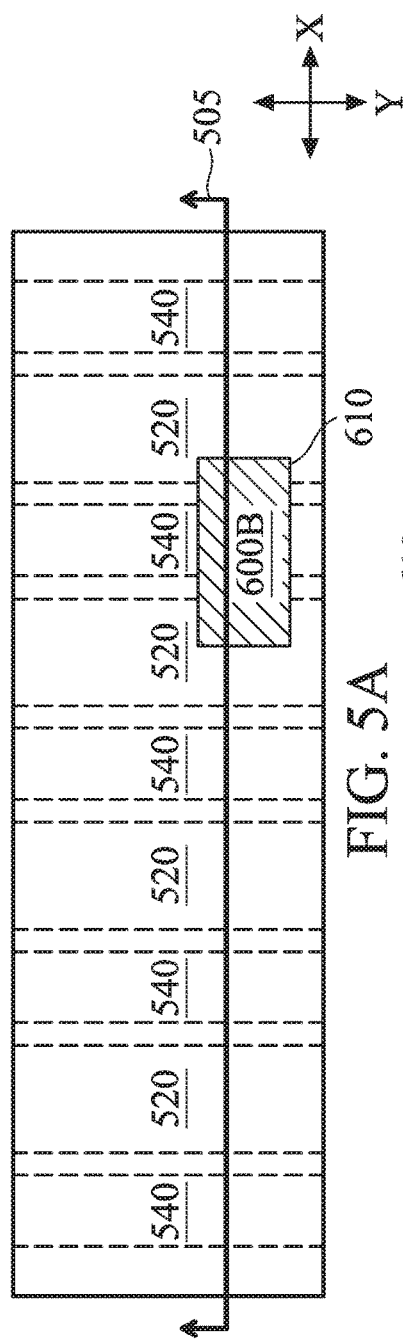
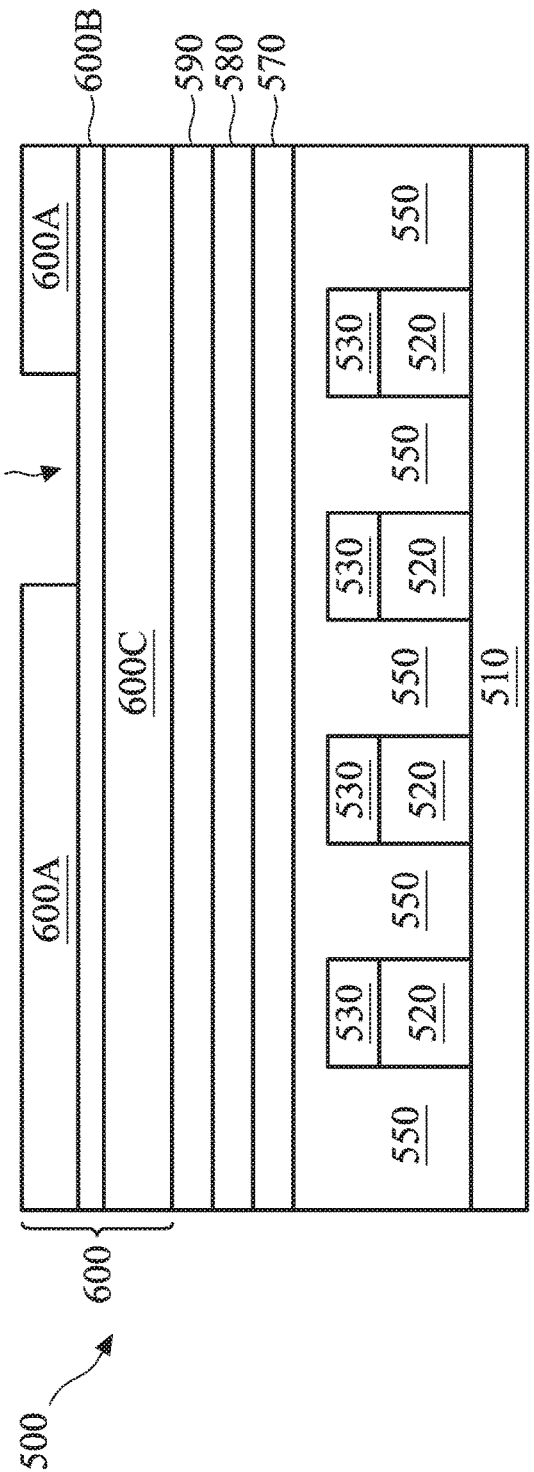
FIG. 5A
FIG. 5B

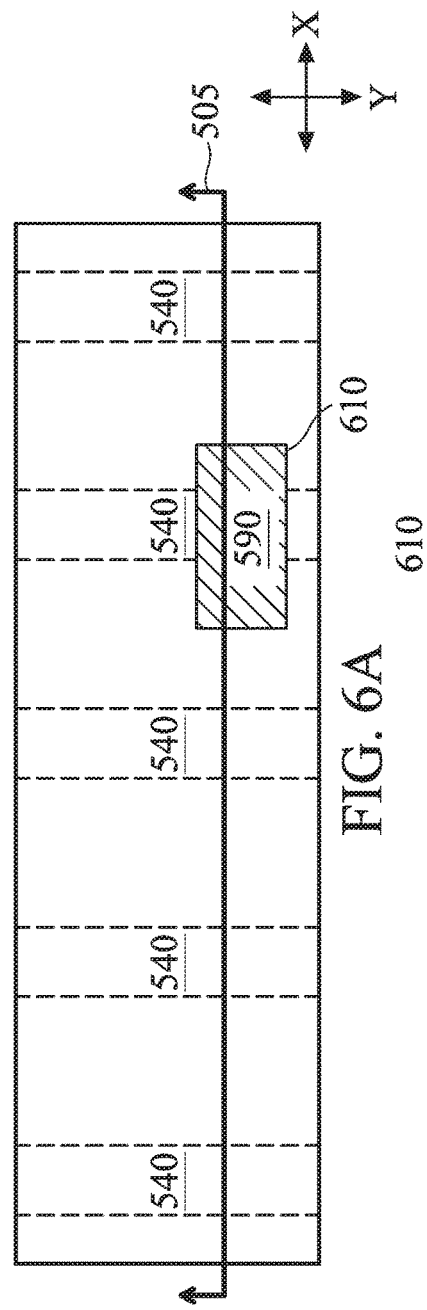
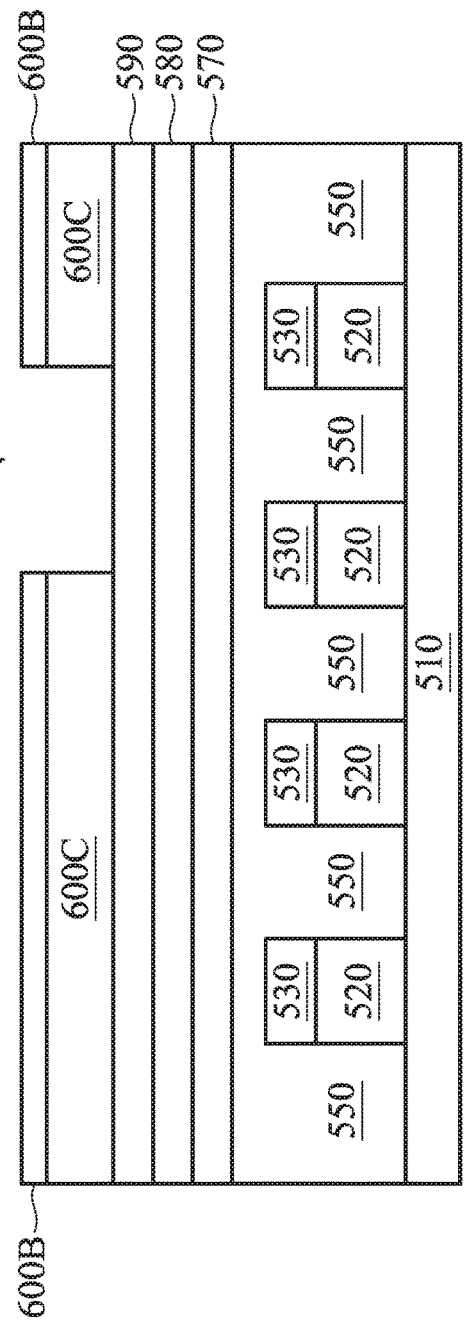
FIG. 6A
FIG. 6B

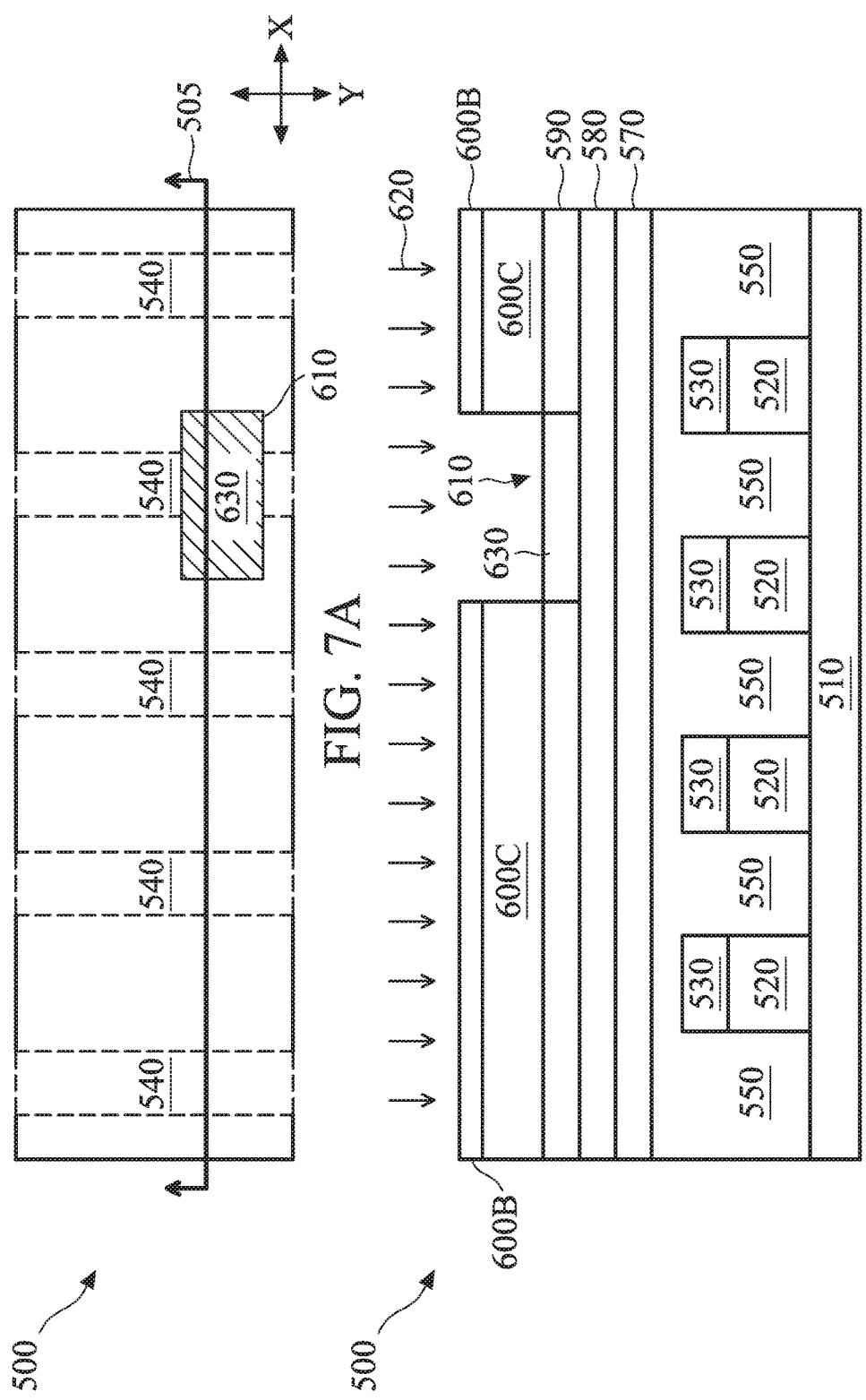

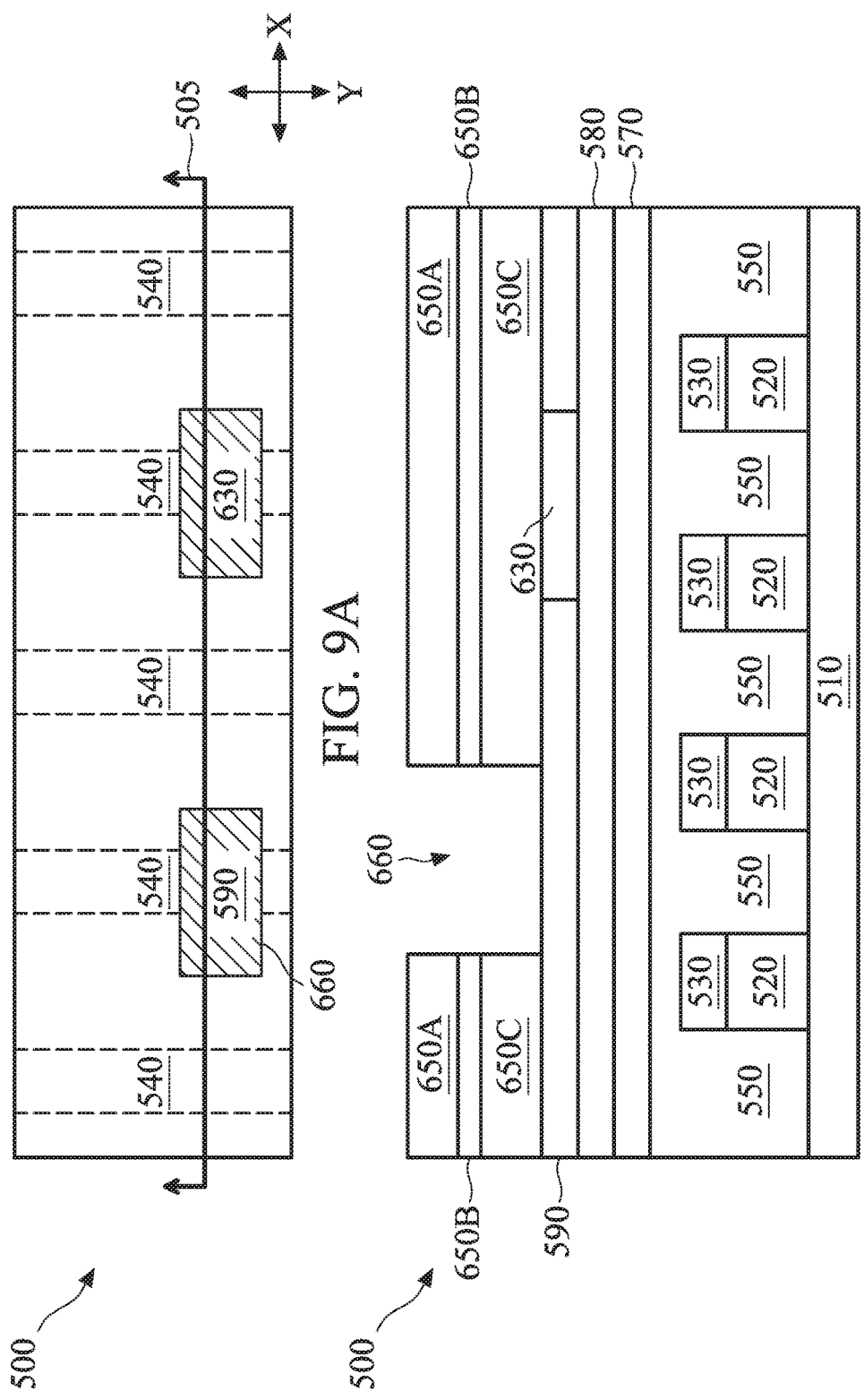

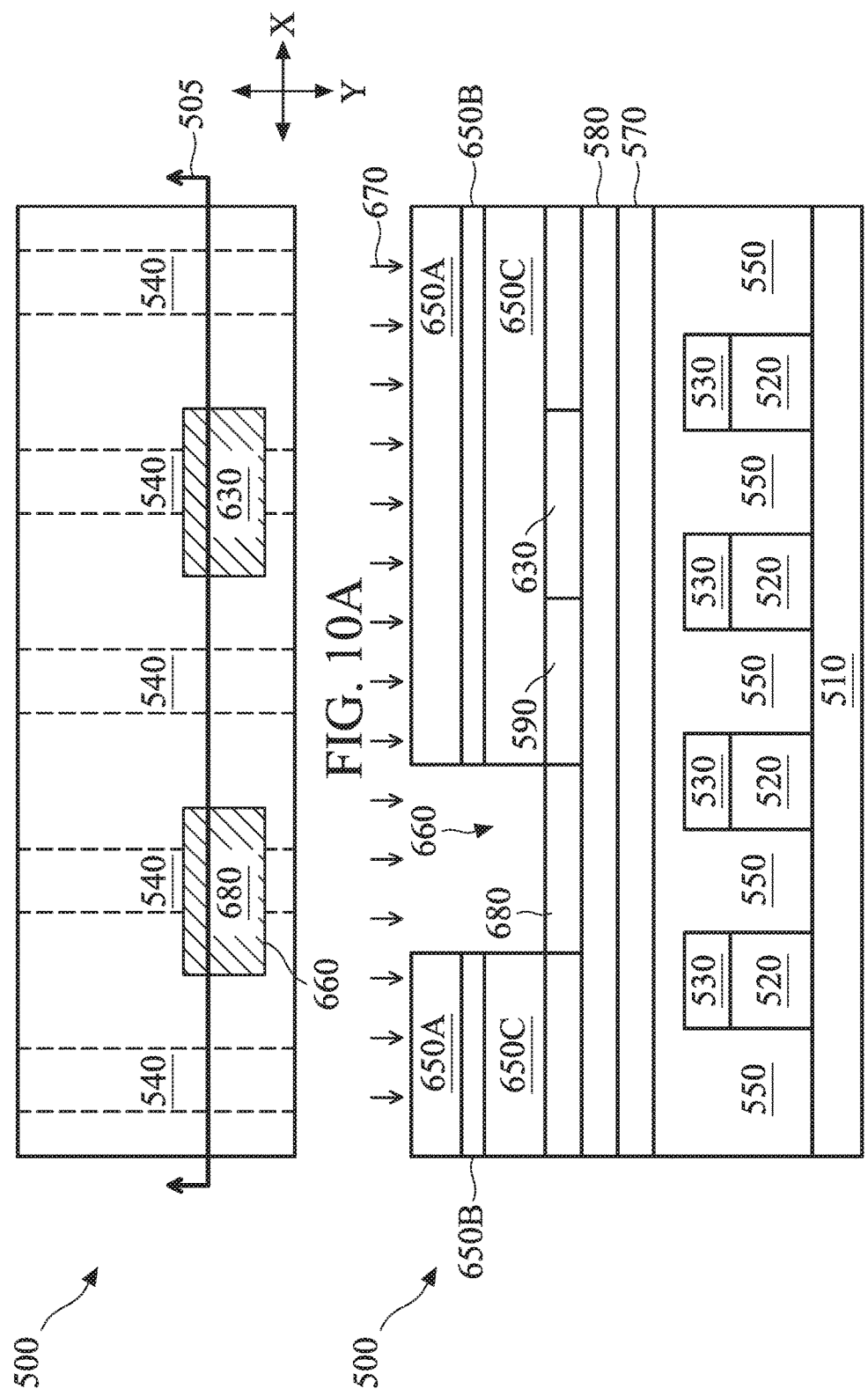

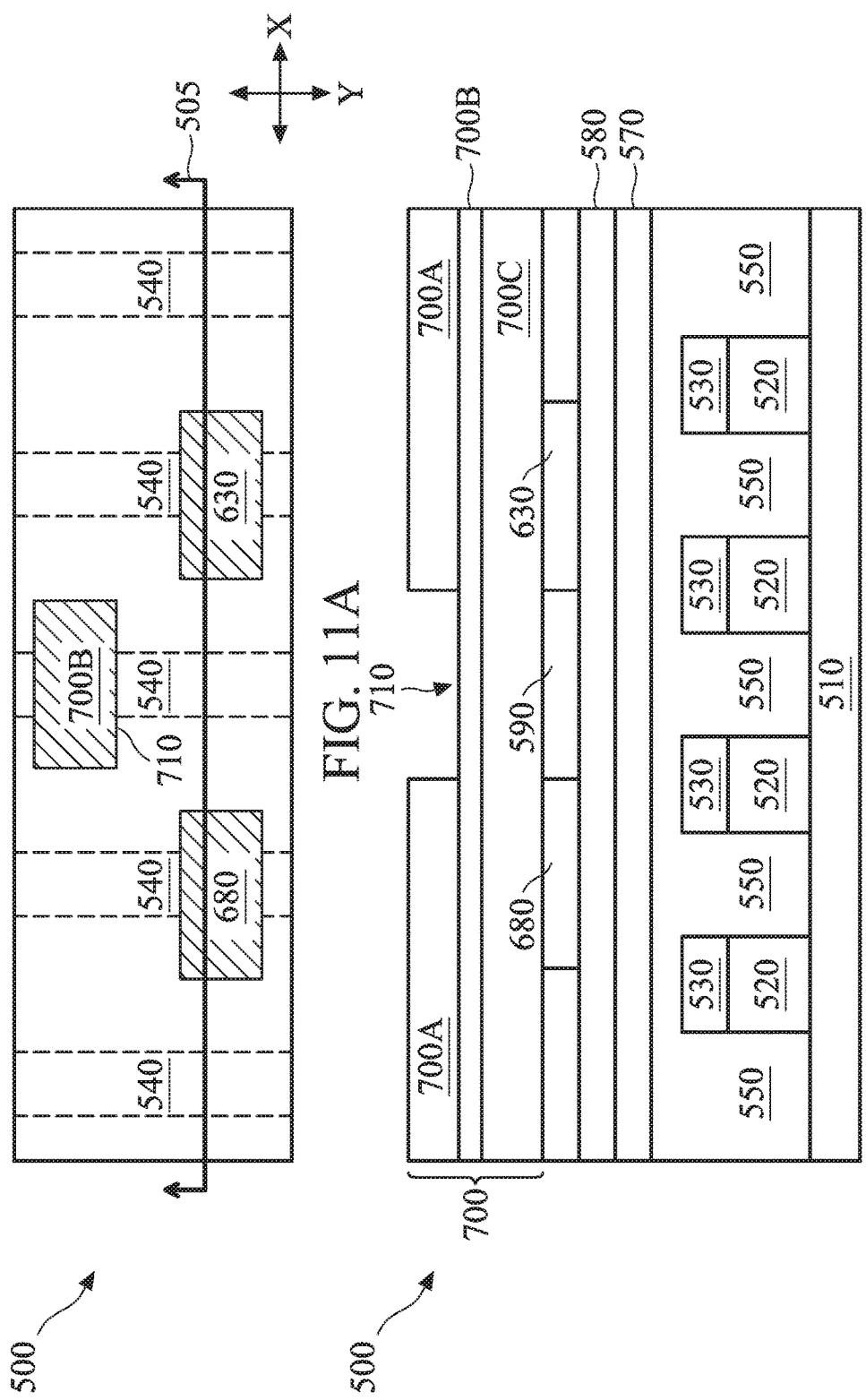

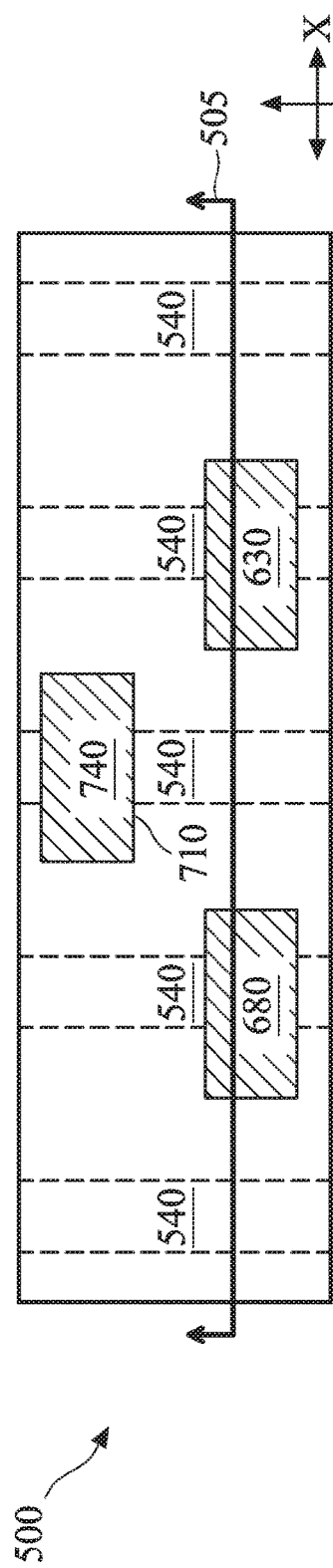
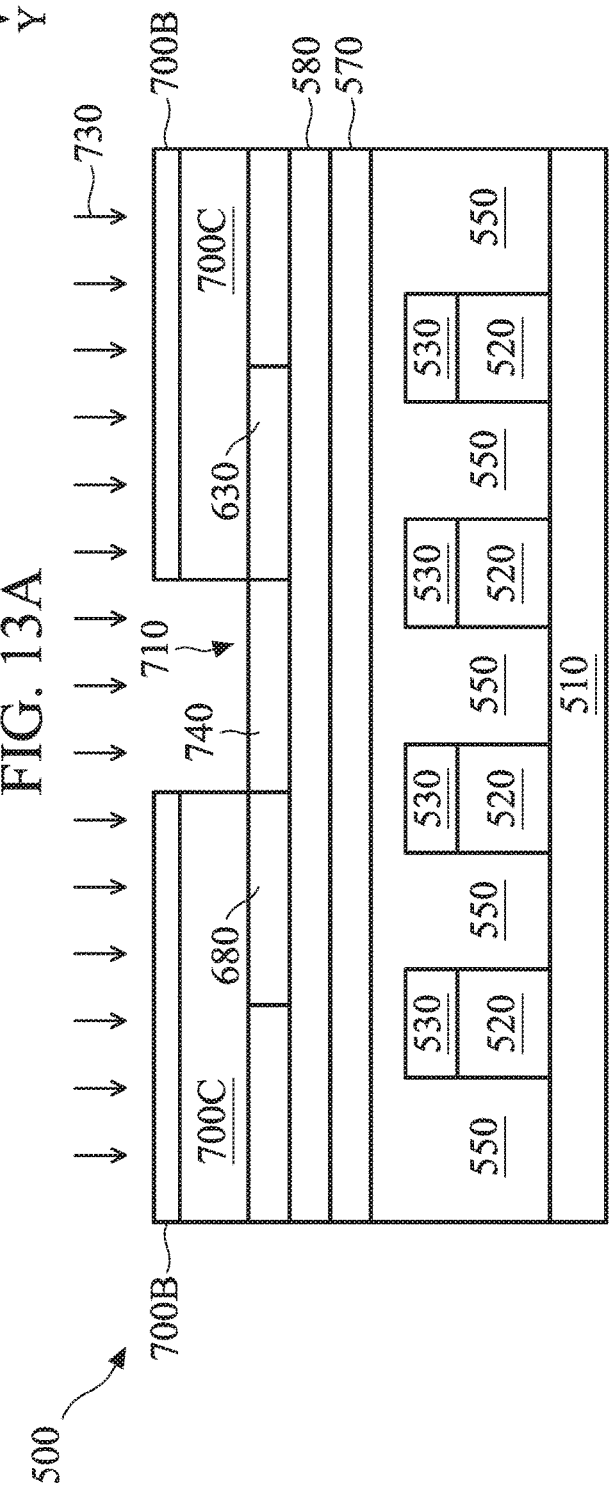
FIG. 13A
FIG. 13B

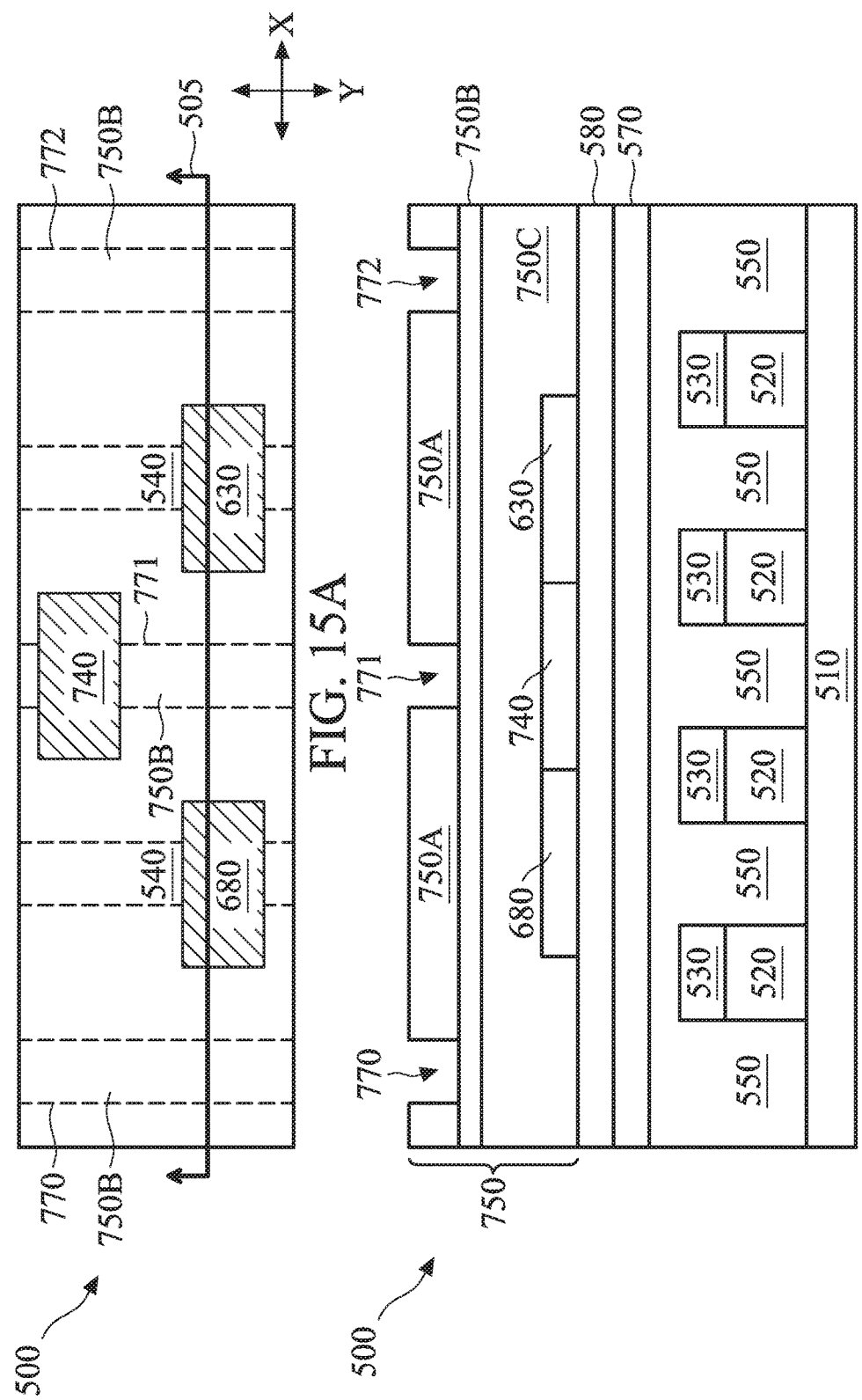

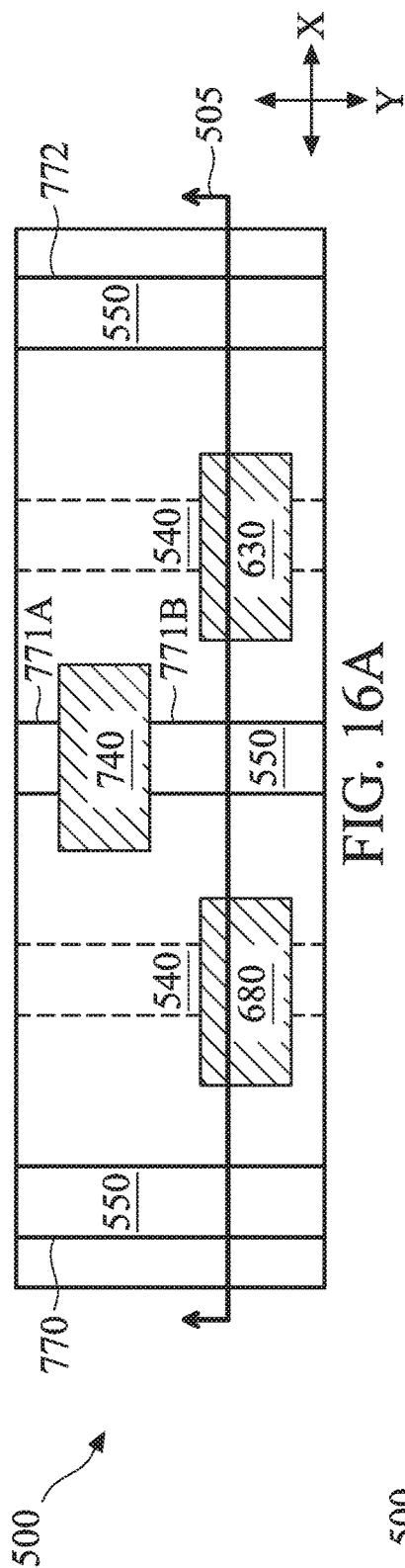
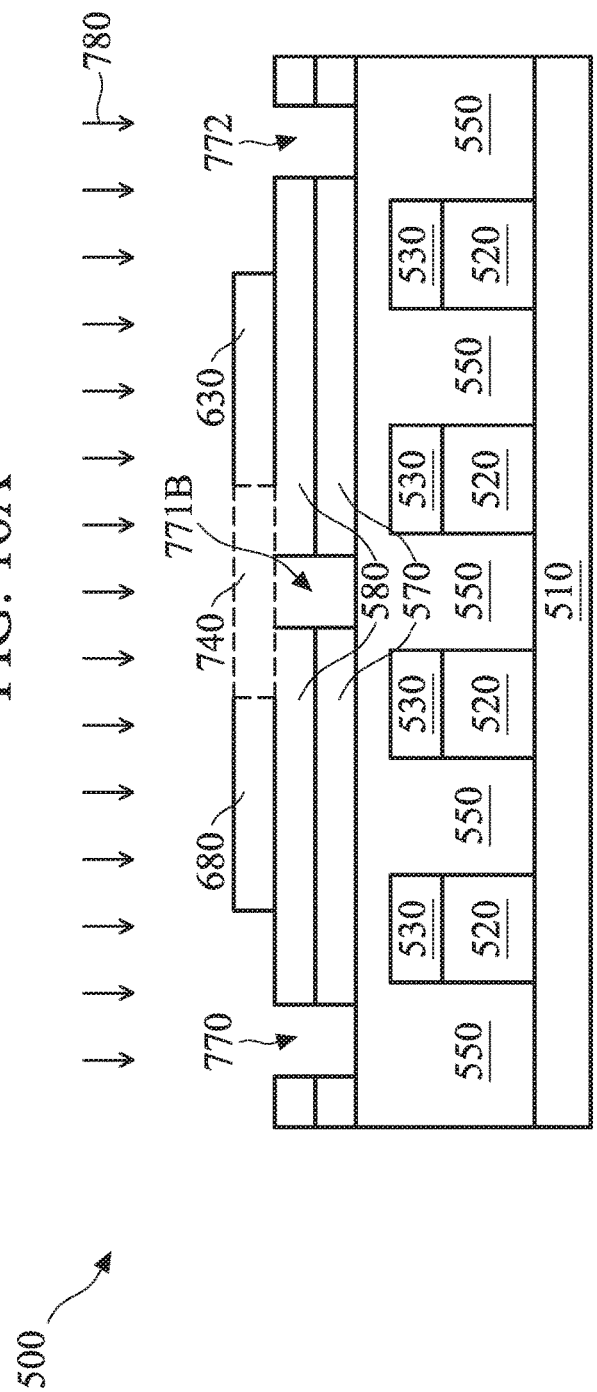
FIG. 16A
FIG. 16B

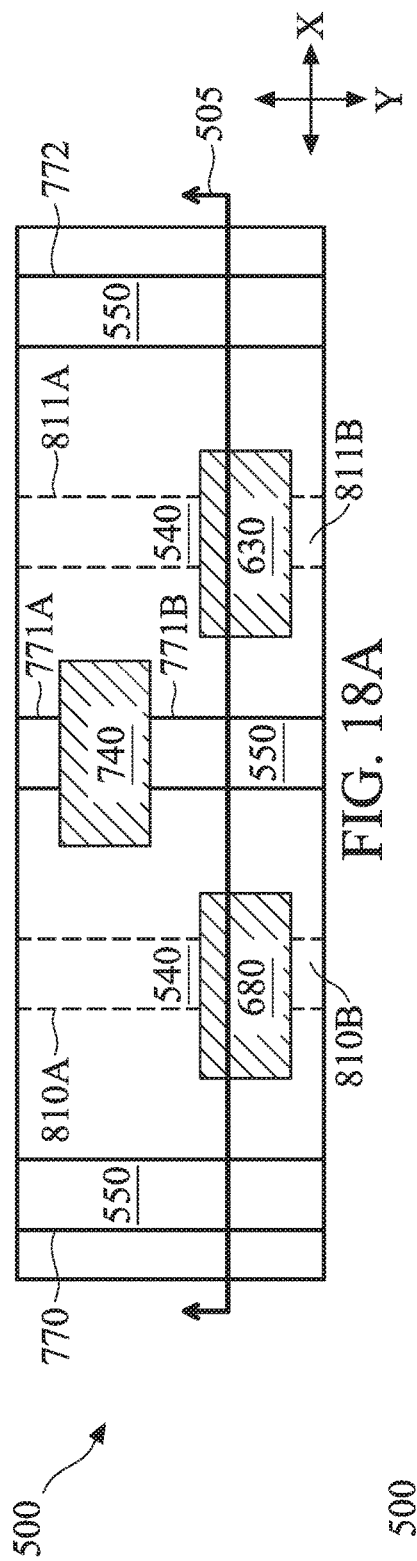
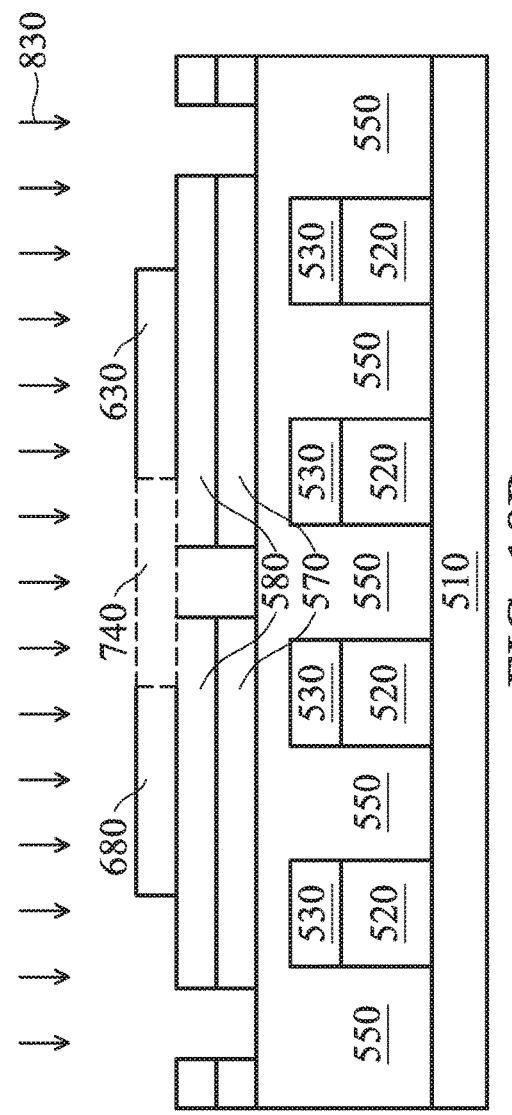
FIG. 18A
FIG. 18B

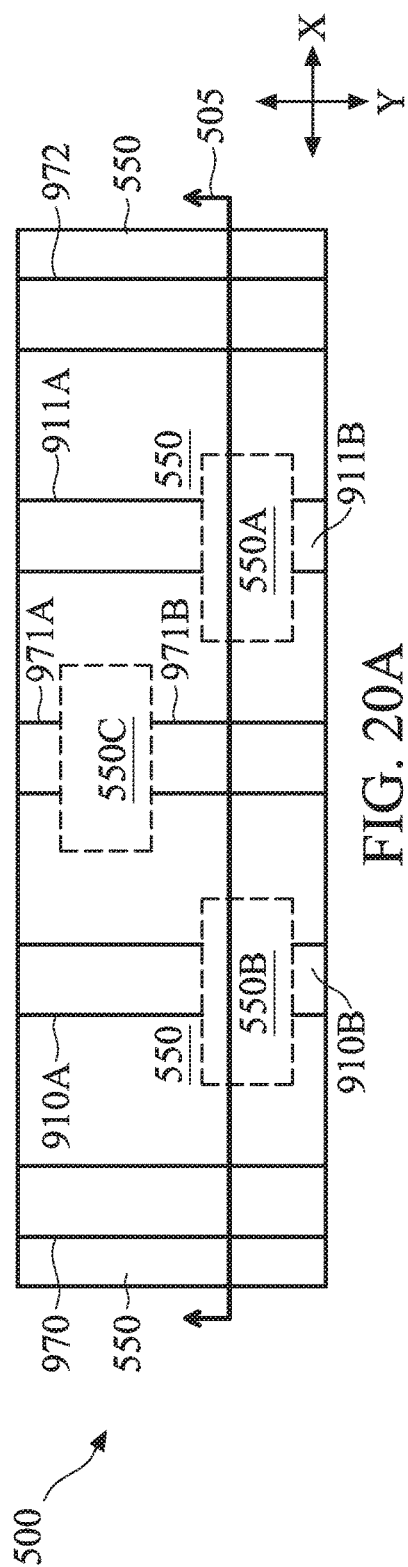
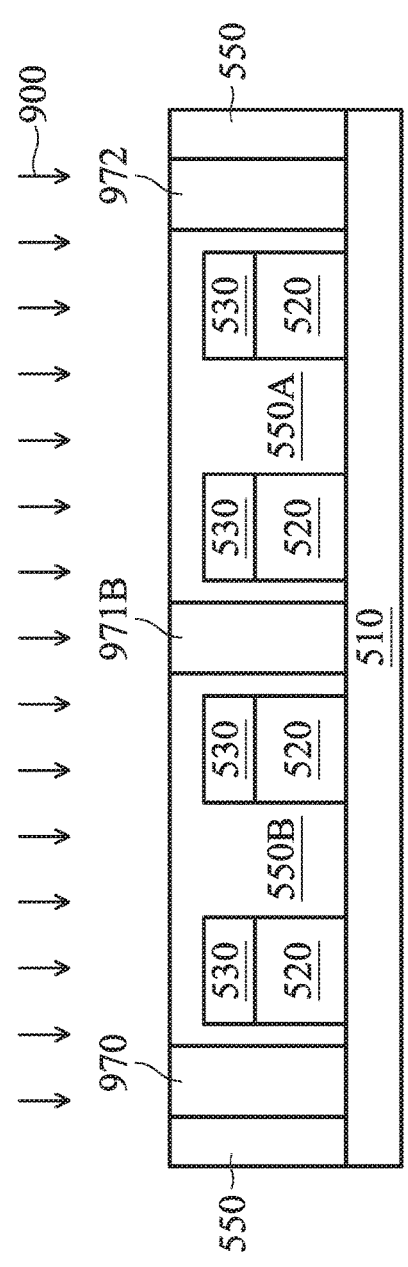
FIG. 20A
FIG. 20B

USING THREE OR MORE MASKS TO DEFINE CONTACT-LINE-BLOCKING COMPONENTS IN FINFET SRAM FABRICATION

BACKGROUND

In deep sub-micron integrated circuit technology, an embedded static random access memory (SRAM) device has become a popular storage unit of high speed communication, image processing and system-on-chip (SOC) products. The amount of embedded SRAM in microprocessors and SOCs increases to meet the performance requirement in each new technology generation. As silicon technology continues to scale from one generation to the next, the impact of intrinsic threshold voltage (Vt) variations in minimum geometry size bulk planar transistors reduces the complimentary metal-oxide-semiconductor (CMOS) SRAM cell static noise margin (SNM). This reduction in SNM caused by increasingly smaller transistor geometries is undesirable. SNM is further reduced when Vcc is scaled to a lower voltage.

To solve SRAM issues and to improve cell shrink capability, fin field effect transistor (FinFET) devices are often considered for some applications. The FinFET provides both speed and device stability. The FinFET has a channel (referred to as a fin channel) associated with a top surface and opposite sidewalls. Benefits can be derived from the additional sidewall device width ($I_{on}$ performance) as well as better short channel control (sub-threshold leakage). Therefore. FinFETs are expected to have advantages in terms of gate length scaling and intrinsic $V_t$ fluctuation. However, existing FinFET SRAM devices still have shortcomings, for example shortcomings related to small process margins between source/drain contacts and/or contact landing on fin structures. In addition, as FinFET SRAM cell sizes shrink, undesirable bridging may occur. These problems could adversely impact FinFET SRAM performance and/or reliability.

Therefore, although existing FinFET SRAM devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

FIGS. 5A-20A are diagrammatic fragmentary top views of an SRAM device at various stages of fabrication according to an embodiment of the present disclosure.

FIGS. 5B-20B are diagrammatic fragmentary cross-sectional side views of an SRAM device at various stages of fabrication according to an embodiment of the present disclosure.

DETAILED DESCRIPTION

Figure 1:
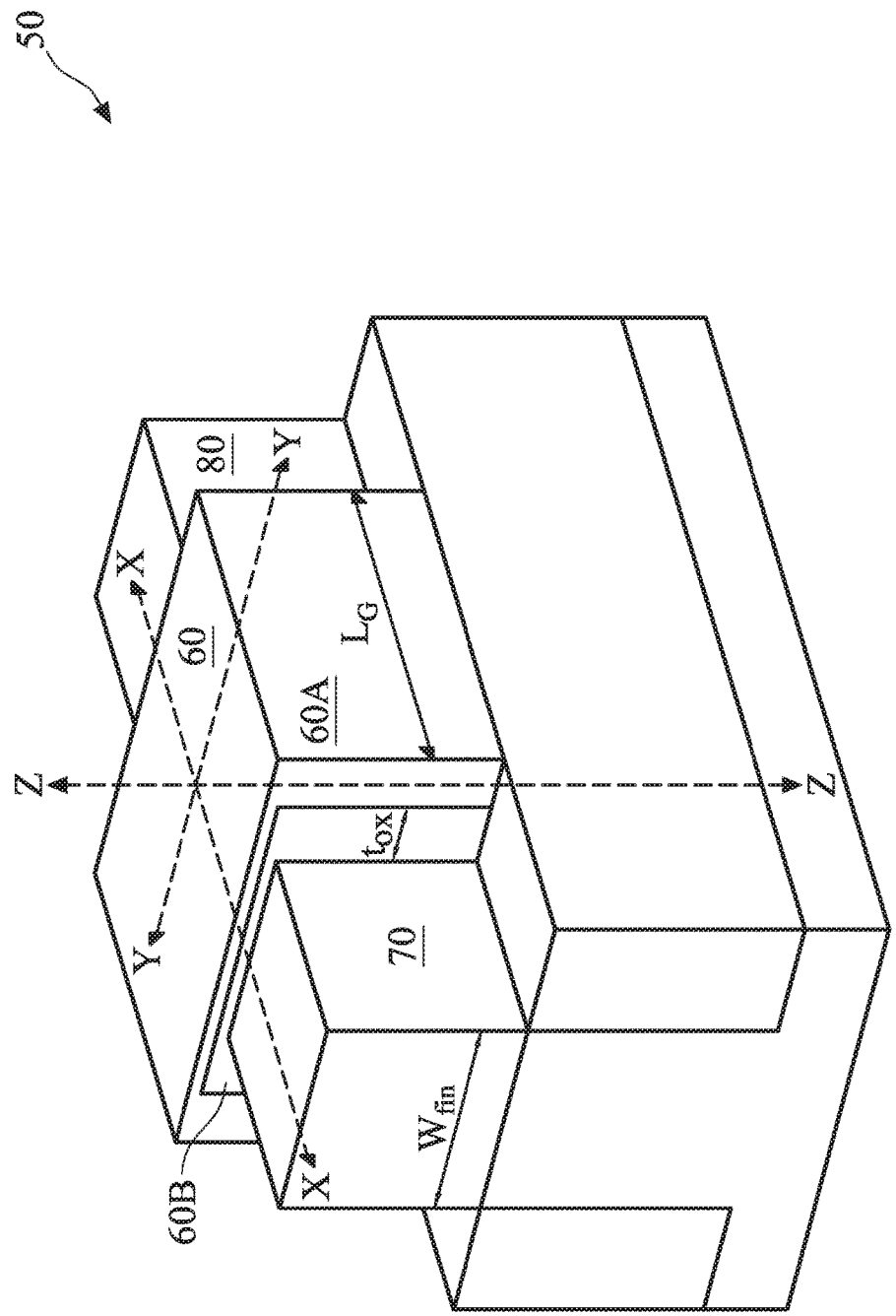
FIG. 1 is a perspective view of an example FinFET device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower." "above." "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to, but not otherwise limited to, a fin-like field-effect transistor (FinFET) device. The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with one or more FinFET examples to illustrate various embodiments of the present disclosure. It is understood, however, that the application should not be limited to a particular type of device, except as specifically claimed.

The use of FinFET devices has been gaining popularity in the semiconductor industry. Referring to FIG. 1, a perspective view of an example FinFET device 50 is illustrated. The FinFET device 50 is a non-planar multi-gate transistor that is built over a substrate (such as a bulk substrate). A thin silicon-containing "fin-like" structure (hereinafter referred to as a "fin") forms the body of the FinFET device 50. The fin extends along an X-direction shown in FIG. 1. The fin has a fin width $W_{fin}$ measured along a Y-direction that is orthogonal to the X-direction. A gate 60 of the FinFET device 50 wraps around this fin, for example around the top surface and the opposing sidewall surfaces of the fin. Thus, a portion of the gate 60 is located over the fin in a Z-direction that is orthogonal to both the X-direction and the Y-direction.

$L_G$ denotes a length (or width, depending on the perspective) of the gate 60 measured in the X-direction. The gate 60 may include a gate electrode component 60A and a gate dielectric component 60B. The gate dielectric 60B has a thickness $t_{ox}$ measured in the Y-direction. A portion of the gate 60 is located over a dielectric isolation structure such as shallow trench isolation (STI). A source 70 and a drain 80 of the FinFET device 50 are formed in extensions of the fin on opposite sides of the gate 60. A portion of the fin being wrapped around by the gate 60 serves as a channel of the FinFET device 50. The effective channel length of the FinFET device 50 is determined by the dimensions of the fin.

FinFET devices offer several advantages over traditional Metal-Oxide Semiconductor Field Effect Transistor (MOSFET) devices (also referred to as planar transistor devices). These advantages may include better chip area efficiency, improved carrier mobility, and fabrication processing that is compatible with the fabrication processing of planar devices. Thus, it may be desirable to design an integrated circuit (IC) chip using FinFET devices for a portion of, or the entire IC chip. One such example is fabricating SRAM cells with FinFET devices.

However, traditional SRAM cells fabricated by FinFET devices may still have shortcomings. For example, existing SRAM fabrication process flow may involve lithography patterning processes to "break up" elongated contact lines, so as to form separate contacts for different components of the SRAM cell. As semiconductor feature sizes continue to shrink, it is more difficult to control the process windows for these patterning processes. As a result, bridging risks between SRAM cell contacts may increase. In addition, it may be more difficult for the contacts to "land" on their intended fins. These issues may degrade SRAM performance or even cause device failures. The present disclosure overcomes these problems discussed above by using additional masks to define the SRAM contacts. The masks for defining the SRAM contacts may also be revised to further improve the SRAM contact definition accuracy and to reduce contact bridging risks, as discussed in more detail below.

Figure 2:
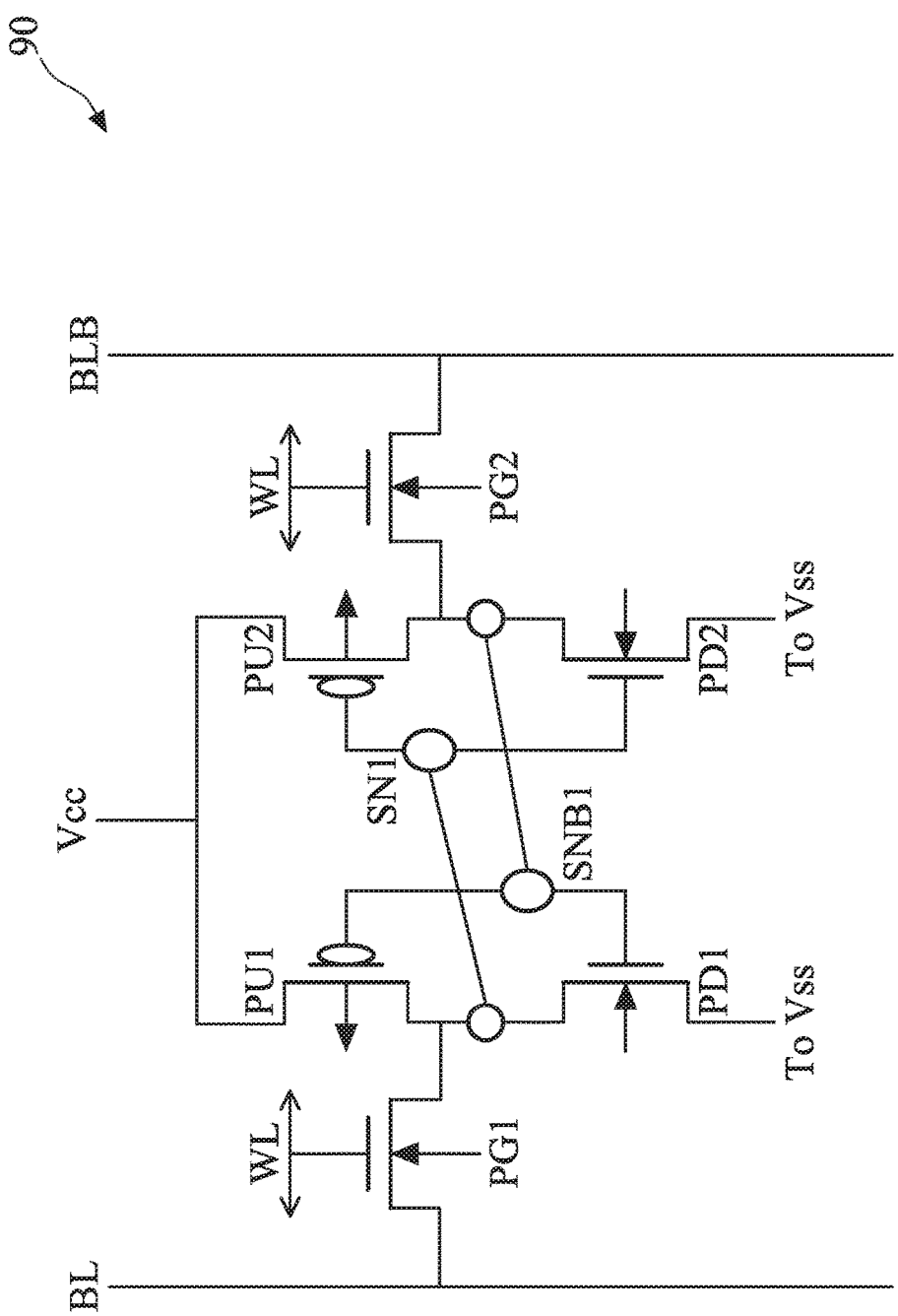
FIG. 2 illustrates a circuit schematic for a 1-bit SRAM cell according to an embodiment of the present disclosure.

FIG. 2 illustrates a circuit schematic for a single-port SRAM cell (e.g., 1-bit SRAM cell) 90. The single-port SRAM cell 90 includes pull-up transistors PU1, PU2; pull-down transistors PD1, PD2; and pass-gate transistors PG1, PG2. As show in the circuit diagram, transistors PU1 and PU2 are p-type transistors, such as the p-type FinFETs discussed above, and transistors PG1, PG2, PD1, and PD2 are n-type FinFETs discussed above.

The drains of pull-up transistor PU1 and pull-down transistor PD1 are coupled together, and the drains of pull-up transistor PU2 and pull-down transistor PD2 are coupled together. Transistors PU1 and PD1 are cross-coupled with transistors PU2 and PD2 to form a first data latch. The gates of transistors PU2 and PD2 are coupled together and to the drains of transistors PU1 and PD1 to form a first storage node SN1, and the gates of transistors PU1 and PD1 are coupled together and to the drains of transistors PU2 and PD2 to form a complementary first storage node SNB1. Sources of the pull-up transistors PU1 and PU2 are coupled to power voltage Vcc (also referred to as Vdd), and the sources of the pull-down transistors PD1 and PD2 are coupled to a voltage Vss, which may be an electrical ground in some embodiments.

The first storage node SN1 of the first data latch is coupled to bit line BL through pass-gate transistor PG1, and the complementary first storage node SNB1 is coupled to complementary bit line BLB through pass-gate transistor PG2. The first storage node NI and the complementary first storage node SNB1 are complementary nodes that are often at opposite logic levels (logic high or logic low). Gates of pass-gate transistors PG1 and PG2 are coupled to a word line WL.

Figure 3:
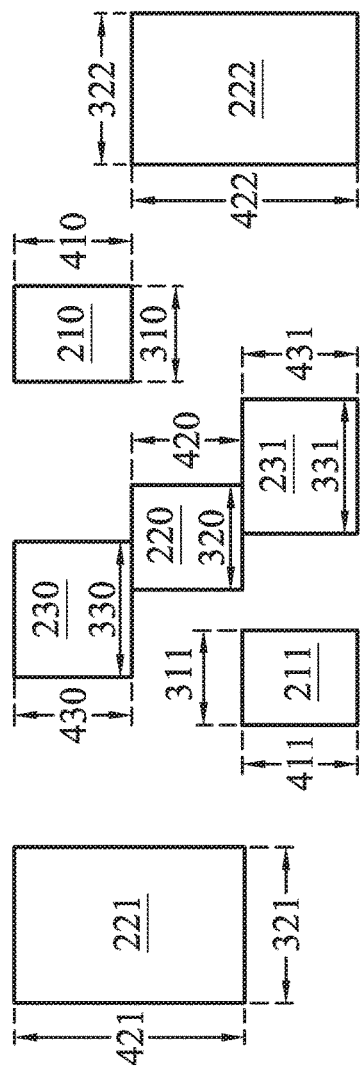
FIG. 3 illustrates a top view of various mask patterns according to an embodiment of the present disclosure.
Figure 4:
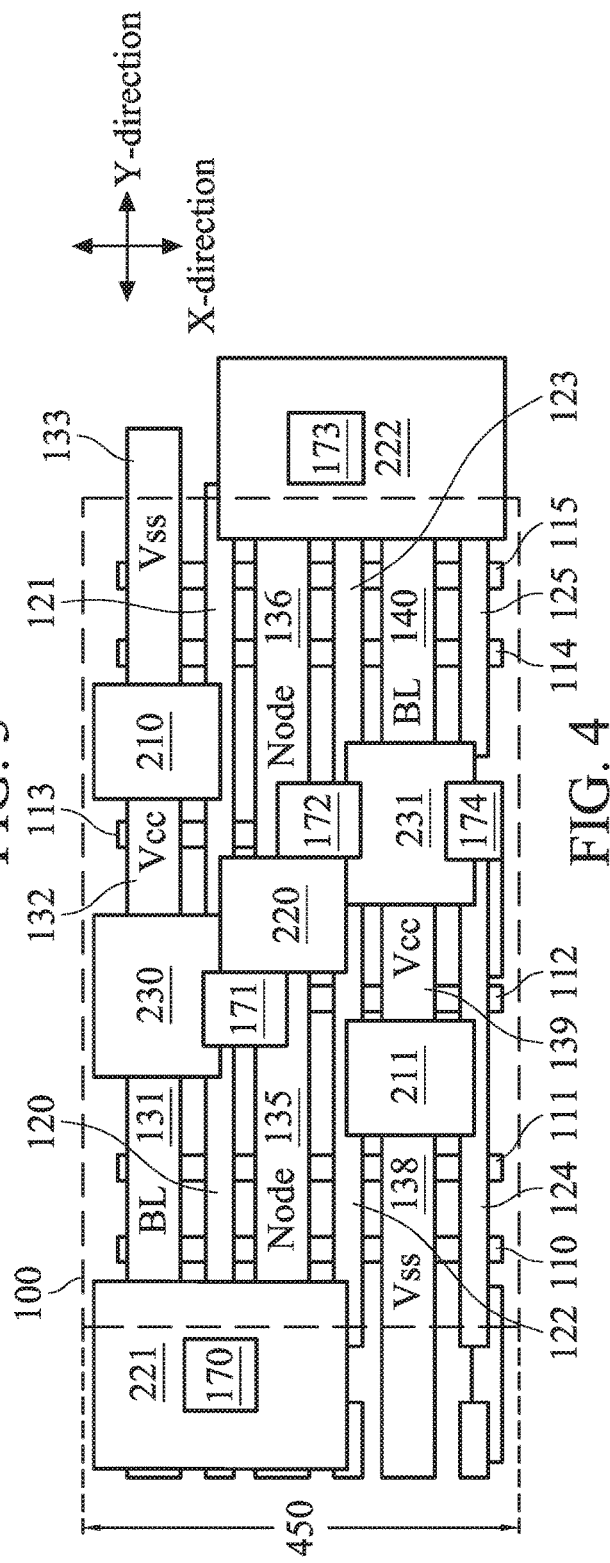
FIG. 4 illustrates a superimposed top view of a 1-bit SRAM cell and the mask patterns of FIG. 3 according to an embodiment of the present disclosure.

Referring now to FIGS. 3-4, FIG. 3 illustrates a plurality of mask patterns used to define the contact lines of an SRAM cell, and FIG. 4 illustrates a fragmentary top view of an SRAM cell with the mask patterns of FIG. 3 superimposed thereon, according to embodiments of the present disclosure. It is understood that the mask patterns of FIG. 3 belong to different lithography masks (discussed in more detail below) but are superimposed together herein for reasons of clarity.

As shown in FIG. 4, the SRAM cells include a plurality of cells, such as a 1-bit SRAM cell 100 (illustrated herein as an example), the circuit schematic of which is shown in FIG. 2 as the circuit schematic of the SRAM cell 90. The elements of the SRAM cell 100 are shown in the top view of FIG. 4 within a box with dashed boundary lines.

The SRAM cell 100 includes a plurality of fin lines 110-115 (also referred to as active region, or OD). The fin lines 110-115 each extend in the X-direction (the same X-direction shown in FIG. 1), and they each represent a fin structure such as the fin structure shown in FIG. 1. The fin lines 110-115 contain a semiconductor material, such as silicon or silicon germanium. Some of the fin lines serve as the source/drain or channel regions for the pull-down transistors, and some of the other fin lines serve as the source/drain or channel regions for the pull-up transistors.

The SRAM cell 100 also includes a plurality of elongated gate structures (also referred to as gate lines) 120-125 that each extend in the Y-direction (the same Y-direction shown in FIG. 1). The gate structures 120-125 each wrap around one or more of the fin lines 110-115 in the manner discussed above with reference to FIG. 1. The gate structures 120-125 and the fin lines 110-115 collectively form at least six transistor devices, for example the PD1, PD2, PG1, PG2, PU1, and PU2 transistor devices of the SRAM cell discussed above with reference to FIG. 2.

A plurality of conductive contacts 130-141 (also referred to as contact lines, since they are each elongated similar to a line) are also shown in the top view of FIG. 4. Disposed within (or at least partially within) the SRAM cell 100 are a bit-line (BL) contact 131, a Vcc (also referred to as Vdd) contact 132, a Vss (also referred to as ground) contact 133, a node contact 135, a node contact 136, a Vss contact 138, a Vcc contact 139, and a BL contact 140. Contacts 170-175 are also formed. The contacts 170-175 are via-to-gate contacts and each couple together a respective gate structure with a conductive via. The contacts 170-175 are not discussed in detail herein, since they do not pertain to the central aspects of the present disclosure.

According to the various aspects of the present disclosure, the contacts 131-140 are formed by "breaking up" longer contact-line trenches (e.g., trenches that will be filled with metal later to form the contacts) through contact-line-blocking components during lithography and etching processes.

For example, the BL contact 131, the Vcc contact 132, and the Vss contact 133 are formed by breaking up what would have been a single contact line into three distinct segments. In more detail, the mask patterns 210 and 230 define "contact-line-blocking components" that overly the path of the single contact line. These contact-line-blocking components serve as etching masks during a later etching process that is performed to form the trench that is the contact line in which the contacts 131-133 will be formed later. Due to the presence of the contact-line-blocking components defined by the mask patterns 210 and 230, what would have been a long and continuous trench is now broken up into three distinct and separate trench segments. These three distinct trench segments are then filled with a conductive material (e.g., a metal such as tungsten, aluminum, copper, or combinations thereof) to form the BL contact 131, the Vcc contact 132, and the Vss contact 133. In this manner, it may be said that the mask patterns 230 and 210 "break up" a single continuous contact line into the three distinct and separate contacts 131-133. In a similar manner, it may be said that the node contacts 135 and 136 are formed by using the mask pattern 220 to "break up" a single continuous contact line into two distinct segments, and the Vss contact 138, the Vcc contact 139, and the BL contact 140 are formed by using the mask patterns 211 and 231 to break up a single continuous contact line into three distinct segments.

It is also understood that the mask pattern 221 is configured to break up a contact line into the segments that form the BL contact 131 and the Vss contact of an adjacent SRAM cell (to the "left" of the SRAM cell 100 but not illustrated herein for reasons of simplicity), as well as breaking up a contact line into the segments that form the node contact 135 and the node contact of the adjacent SRAM cell. Similarly, the mask pattern 222 is configured to break up a contact line into the segments that form the BL contact 140 and the Vss contact of an adjacent SRAM cell (to the "right" of the SRAM cell 100 but not illustrated herein for reasons of simplicity), as well as breaking up a contact line into the segments that form the node contact 136 and the node contact of the adjacent SRAM cell.

In order to avoid or reduce SRAM contact bridging risks, the present disclosure implements the mask patterns 210-211, 220-222, and 230-231 on at least three different masks. According to one embodiment of the present disclosure, the mask patterns 210-211 are implemented on one mask, the mask patterns 220-222 are implemented on another mask, and the mask patterns 230-231 are implemented on yet another mask. Of course, it is understood that the arrangement of the patterns 210-211, 220-222, and 230-231 into the three different masks is merely an example and is not intended to be limiting, and that these patterns may be arranged onto the three masks differently in alternative embodiments. Furthermore, it is understood that more than three masks (e.g., four masks) may be used in other alternative embodiments to implement the mask patterns 210-211, 220-222, and 230-231.

The separation of the mask patterns 210-211, 220-222, and 230-231 onto at least three masks provides more tuning freedom for each individual mask pattern in terms of its size and shape, which may be used to reduce the SRAM contact bridging risks and improve contact-to-fin-landings. In more detail, as semiconductor device sizes continue to shrink, it is increasingly more difficult to control the exact location and alignment of the mask patterns 210-211, 220-222, and 230-231 relative to the contact lines. As discussed above, the mask patterns 210-211, 220-222, and 230-231 are used to "break up" the SRAM contacts, and a shift of these mask patterns from their intended locations may lead to problems for the SRAM contacts.

For example, the mask pattern 210 is meant to "break up" a contact line into the Vcc contact 132 and the Vss contact 133. However, if the size of the mask pattern 210 is too small, it may not be able to sufficiently separate the Vcc contact 132 and the Vss contact 133, since even a small continuity between the Vcc contact 132 and the Vss contact 133 can cause a bridging between these two contacts. The bridging between the Vcc contact 132 and the Vss contact 133 may also occur if the location of the mask pattern 210 is shifted, for example shifted "upwardly" or "downwardly" in an X-direction in FIGS. 3-4. On the other hand, if the size of the mask pattern 210 is too large, it may "swallow up" a part of (or all of) the Vcc contact 132. In other words, a sufficiently large mask pattern 210 may cause the Vcc contact 132 to be formed to be too small, or never be formed at all, as the large mask pattern 210 would have "blocked" the formation of the Vcc contact 132. This could also occur if the mask pattern 210 is shifted to the "left" too much in the Y-direction in FIGS. 3-4. The unintended bridging between SRAM contacts may cause the SRAM device to malfunction or have degraded performance.

The size variations and/or locational offsets of the mask patterns 210-211, 220-222, and 230-231 may also lead to "contact-to-fin-landing" problems. For example, if the mask pattern 220 is too small or if it is shifted "upwardly" or "downwardly" in the X-direction in FIGS. 3-4, it may cause the node contact 135 to bridge with the node contact 136. On the other hand, if the mask pattern 220 is too large, it may cause the node contact 135 to not "land" on the fin line 112, or cause the node contact 136 to not "land" on the fin line 113. The node contacts 135-136 may also missing their intended landings if the mask pattern 220 is shifted to the "left" or "right" in the Y-direction in FIGS. 3-4. If a contact misses a "landing" on its intended fin line, this means an electrical connection that should have been made for a given transistor is not made, and this may also cause the SRAM device to malfunction or have degraded performance.

The contact bridging and/or fin-landing problems discussed above are further complicated if too many mask patterns are fitted onto the same mask. Due to limitations in lithography (particularly as device sizes become small), adjusting the size and/or location of any given mask pattern may lead to unintended changes to (or bridging with) other mask patterns on that mask, which may adversely impact the contact bridging and/or fin-landing problems in other parts of the SRAM cell. As an example, if the mask patterns 210 and 231 are formed using the same lithography mask, then enlarging or shifting the mask pattern 210 in the X-direction in FIGS. 3-4 may cause the mask patterns 210 and 231 to bridge with each other. The bridging of the mask patterns 210 and 231 may "cut off" the "left" portion of the node contact 136, which could cause the node contact 136 to miss its "landing" on the fin line 113.

Furthermore, due to lithography constraints, mask patterns that are too close to one another should not be arranged onto the same mask. For example, if the mask patterns 210 and 230 are arranged onto the same mask, the distance separate them may be too small to be resolved by lithography, and as a result the boundaries of the mask patterns 210 and 230 may not be clearly defined.

Another concern for lithography mask design is pattern uniformity. In more detail, it is easier for lithography to resolve a plurality of patterns if these patterns are relatively uniform with one another in terms of geographical shape and/or size. As such, it is undesirable to implement different patterns onto the same lithography mask, where one of the patterns is substantially larger than the other.

The present disclosure overcomes the problems discussed above by splitting up the mask patterns 210-211, 220-222, and 230-231 into three masks (or more in alternative embodiments). One benefit for doing so is that tuning any one of the mask patterns is unlikely to affect other patterns. For example, the mask pattern 210 may be stretched or enlarged in the X-direction. This helps to ensure that the mask pattern 210 can serve its purpose of patterning a contact-line-blocking component to "break up" the Vcc contact 132 and the Vss contact 133. In other words, since the mask pattern 210 is larger in the X-direction, it provides a bigger process margin to tolerate size variations or locational offsets caused by lithography imperfections.

The enlargement or stretching of the mask pattern 210 also does not increase bridging risks with the mask pattern 231, because as discussed above, the mask patterns 210 and 231 are implemented on different masks. As such, the mask patterns 210 and 231 are used in different process steps, and thus the stretching of the mask pattern 210 will not cause unintended bridging with the mask pattern 231. Similarly, the mask pattern 230 can be stretched or enlarged in the X-direction, without worrying about causing unintentional bridging with the mask pattern 211, since the mask pattern 211 is implemented on a different mask.

The stretching or enlargement of the mask pattern 210 (or 230) is one example of tuning the mask patterns. It is understood that other mask patterns may be flexibly adjusted in other embodiments to address the SRAM contact-bridging or contact-to-fin-landing issues, without departing from the spirit or the scope of the present disclosure.

As shown in FIG. 3, the sizes or dimensions of the mask patterns 210-211, 220-222, and 230-231 are configured to facilitate the breaking up of the SRAM contact lines. For example, the mask patterns 210-211, 220-222, and 230-231 have dimensions 310-311, 320-322, and 330-331, respectively, that are measured in the Y-direction of FIG. 3. The mask patterns 210-211, 220-222, and 230-231 have dimensions 410-411, 420-422, and 430-431, respectively, that are measured in the X-direction of FIG. 3. In some embodiments, the dimensions 310-311 are configured to similar to one another, the dimensions 410-411 are configured to similar to one another, the dimensions 330-331 are configured to similar to one another, the dimensions 430-431 are configured to similar to one another, the dimensions 321-322 are configured to similar to one another, and the dimensions 421-422 are configured to similar to one another. In some embodiments, in order to facilitate the breaking up of the SRAM contact lines, the dimensions 310-311 are configured to be smaller than the dimensions 330-331, and the dimensions 330-331 are configured to be smaller than the dimensions 321-322.

As discussed above, some of the mask patterns herein may be stretched or enlarged to widen the process margin. For example, in some embodiments, whereas the mask patterns 210 and 230 may previously have similar dimensions 410 and 430, the mask pattern 210 may now have its dimension 410 stretched in the X-direction, such that the dimension 410 is now greater than the dimension 430. The same may be true for the mask pattern 211 (the pattern being stretched) and the mask pattern 231 in some embodiments.

The dimensions of the mask patterns 210-211, 220-222, and 230-231 may also be configured as a function of the size or dimensions of the SRAM cell 100. For example, as shown in FIG. 4, the SRAM cell 100 has a pitch 450 measured in the X-direction. In some embodiments, the dimensions 421-422 are each configured to be greater than ½ of the pitch 450.

The dimensions of the mask patterns are also configured to ensure uniformity among mask patterns that are arranged onto the same lithography mask. As discussed above, the mask patterns 210-211 are arranged onto the same lithography mask in the illustrated embodiment, and thus the mask patterns 210-211 may have similar dimensions 310-311, and similar dimension 410-411. The mask patterns 220-222 are arranged onto another lithography mask in the illustrated embodiment, and thus the mask patterns 220-222 may have similar dimensions 320-322, and similar dimension 420-422. The mask patterns 230-231 are arranged onto the same lithography mask in the illustrated embodiment, and thus the mask patterns 230-231 may have similar dimensions 330-331, and similar dimension 430-431. In some embodiments, these various dimensions discussed above may be considered similar if they vary within +50% or −50% of one another. As such, the similar dimensions for the mask patterns that are located on the same mask ensure that each mask offers good pattern uniformity. In addition, the mask patterns 210-211, 220-222, and 230-231 are each implemented as a rectangle (even if the rectangles have different X-dimension-to-Y-dimension ratios). The shape similarities of the mask patterns (especially within the same lithography mask) further improves the pattern uniformity for the lithography masks of the present disclosure.

It is also understood that the present disclosure allows the generation of new mask layout plans. For example, a conventional mask layout plan may be received. According to the conventional mask layout plan, all the mask layout patterns for defining the contact-line-blocking components are arranged into just one (or two) lithography masks. As discussed above, this is undesirable since it leads to contact bridging problems, contact-to-fin landing difficulties, etc. According to a method of the present disclosure, after receiving the conventional mask layout plan, a new mask layout plan may be generated, such that the mask patterns of the conventional layout plan are now divided onto three or more lithography masks. In some embodiments, at least one of the mask patterns (e.g., the mask pattern 210) is stretched or enlarged in a direction perpendicular to the direction in which the contact lines extend. This reduces potential contact line bridging risks.

The fabrication process flow of forming/defining contact-blocking components using these mask patterns 210-211, 220-222, and 230-231 will now be discussed. In more detail, FIGS. 5A-20A are diagrammatic fragmentary top views of a semiconductor device 500 at different stages of fabrication, and FIGS. 5B-20B are diagrammatic fragmentary cross-sectional side views of the semiconductor device 500 at different stages of fabrication, according to embodiments of the present disclosure. It is understood that the cross-sectional side views of FIGS. 5B-20B are obtained with an X-cut, that is, according to a cutline taken in the X-direction of FIG. 4. An example of this cutline is illustrated in FIGS. 5A-20A as cutline 505. The semiconductor device 500 may be an embodiment of the SRAM cell 100 discussed above with reference to FIGS. 2 and 4.

Referring now to FIGS. 5A-5B, the semiconductor device 500 includes a semiconductor layer 510 that is formed over a substrate. In an embodiment, the semiconductor layer 510 includes a crystal silicon material, such as silicon or silicon germanium. An implantation process may be performed to implant a plurality of dopant ions to the semiconductor layer 510. The dopant ions may include an n-type material in some embodiments, for example arsenic (As) or phosphorous (P), or they may include a p-type material in some other embodiments, for example boron (B), depending on whether an n-type FET (NFET or NMOS) or a p-type FET (PFET or PMOS) is needed. For example. Nwells may be formed for the PFET, and Pwells may be formed for the NFET.

A plurality of fin structures is formed by patterning the semiconductor layer 510 through one or more lithography processes. The fin structures may serve as the source, drain, or channel regions of FinFET transistors the semiconductor device 500. The fin structures may be arranged in the manner discussed above with reference to FIG. 4, for example as fin lines 110-115 that each extend in the X-direction. The fin structures are not directly visible in the cross-sectional view of FIG. 5B, as the X-directional cut line is taken in a portion of the SRAM cell outside the fin structures.

A plurality of gate stacks 520 may be formed. The gate stacks 520 may each correspond to a different one of the gate lines 120-125 discussed above with reference to FIG. 4. The gate stacks 520 may be formed by one or more patterning processes using hard masks 530 and may involve a gate replacement process, in which dummy gates are replaced by high-k metal gates. For example, the gate stacks 520 may each include a high-k gate dielectric and a metal gate electrode. The high-k gate dielectric may include a dielectric material having a dielectric constant that is greater than a dielectric constant of SiO2, which is approximately 4. In an embodiment, the high-k gate dielectric includes hafnium oxide (HfO2), which has a dielectric constant that is in a range from approximately 18 to approximately 40. In alternative embodiments, the high-k gate dielectric may include ZrO2, Y2O3, La2O5, Gd2O5, TiO2, Ta2O5, HfErO, HfLaO, HfYO, HfGdO, HfAlO, HfZrO, HfTiO, HfTaO, or SrTiO. The metal gate electrode may include a work function metal component and a fill metal component. The work functional metal component is configured to tune a work function of its corresponding FinFET to achieve a desired threshold voltage Vt. In various embodiments, the work function metal component may contain: TiAl, TiAlN, TaCN, TiN, WN, or W, or combinations thereof. The fill metal component is configured to serve as the main conductive portion of the gate electrode. In various embodiments, the fill metal component may contain Aluminum (Al), Tungsten (W), Copper (Cu), or combinations thereof.

Although the gate stacks 520 are not directly visible in the top view at this stage of fabrication, the outlines of the gate stacks 520 (illustrated as dashed lines) are illustrated in the top view of FIG. 5A to facilitate the understanding of the present disclosure. Note that the top view of FIG. 5A is "rotated" 90 degrees compared to the top view of FIG. 4. In other words, the X-direction and the Y-direction are each rotated in 90 degrees between FIGS. 4 and 5A. Nonetheless, it is understood that the gate stacks 520 still extend in the Y-direction in both FIG. 4 and FIG. 5A.

Also shown in the top view of FIG. 5A are the outlines of the contact lines 540, which are also illustrated with dashed lines herein. The contact lines 540 each correspond to a different one of the contact lines from which the BL, Vcc, Vss, and node contacts (shown in FIG. 4) are formed. As is shown in FIG. 5A, the contact lines 540 each extend in the Y-direction, and a different contact line 540 is disposed between each pair of gate lines 520. It is understood that at the stage of fabrication of FIGS. 5A-5B, the contact lines 540 have not been defined yet (i.e., they do not exist yet), and the illustration of the outlines of contact lines 540 is merely to facilitate the understanding of the present disclosure.

As shown in FIG. 5B, the gate stacks 520 are surrounded by (or embedded in) an interlayer dielectric (ILD) 550. The ILD 550 may be formed by depositing a dielectric material and performing a polishing process such as chemical-mechanical-polishing (CMP) to planarize the upper surface of the ILD 550. The ILD 550 provides electrical insulation for the gate stacks 520 and may include an electrically-insulating material such as silicon oxide. It is understood that the ILD 550 may be formed before the gate stacks 520. For example, the ILD 550 may be formed after the dummy gate structures (e.g., containing polysilicon gate electrodes) are formed. The removal of the dummy gate structures may create openings or recesses in the ILD, and these openings or recesses may then be filled with high-k metal gate structures (e.g., the gate stacks 520).

A layer 570 is formed over the ILD 550. In some embodiments, the layer 570 includes a dielectric material, for example titanium nitride. A layer 580 is then formed over the layer 570. In some embodiments, the layer 580 includes a dielectric material different from the dielectric material of the layer 570. For example, the layer 580 may include an oxide material such as silicon oxide. The layers 570 and 580 may collectively serve as hard mask layers in a subsequent patterning process to define contact line trenches. A layer 590 is then formed over the layer 580. In some embodiments, the layer 590 includes silicon. In the embodiments discussed herein, the layer 570, 580, and 590 may be used for patterning, for example to pattern the trenches that correspond to the contact lines discussed above with reference to FIG. 4.

A patterned photoresist layer 600 is formed over the layer 590. In the illustrated embodiment, the photoresist layer 600 is a tri-layer photoresist and includes a top layer 600A, a middle layer 600B, and a bottom layer 600C. The photoresist layer 600 has been patterned in a manner such that an opening 610 is formed in the top layer 600A. The opening 610 is formed by a lithography mask containing one of the mask patterns 210-211, 220-222 and 230-231 discussed above with reference to FIG. 4. For example, the opening 610 may be defined by the mask pattern 210. The top view outline of the opening 610 is illustrated in FIG. 5A.

As shown in the cross-sectional view of FIG. 5B, the location of the opening 610 is configured such that it is vertically aligned with one of the contact lines 540 (the contact line 540 will be formed later). As shown in the top view of FIG. 5A, the size of the opening 610 is also configured to cause a "break" in the contact line 540 with which it is aligned. In more detail, the subsequent processes performed using the opening 610 will cause a blocking component to be formed in the ILD 550. Since the contact line trenches will be formed in the ILD 550, the blocking component in the ILD 550 will prevent the formation of a continuous contact line. Instead, the contact lines will be formed as two distinct and separate contacts (e.g., the Vcc contact 132 and the Vss contact 133) as a result of the contact-line-blocking components defined by the opening 610. This will become more apparent based on the detailed discussions below.

Note that as discussed above, the opening 610 may also be "stretched" in the X-direction to ensure that the positional shifts or size variations of the opening 610 will not affect its "breaking" of the contact line 540, thereby relaxing the process window and/or increasing the process margin. The "stretched" opening 610 may overlap with the nearby gate stacks 520 in the top view of FIG. 5A, but this is not a problem since the subsequent processes using the opening 610 will not affect the already-formed gate stacks 520.

Referring now to FIGS. 6A-6B, the opening 610 is extended downwardly into the layers 600B-600C of the patterned photoresist 600, and the top layer 600A of the photoresist 600 is removed. Note that in the top view of FIG. 6A (and in the top view figures for subsequent fabrication stages), the outlines of the yet-to-be formed contact lines 540 are still illustrated to facilitate the ensuing discussions, but the outlines of the gate stacks 520 are not specifically illustrated for reasons of clarity and simplicity. It can be seen in FIG. 6B that the opening 610 now exposes a portion of the layer 590.

Referring now to FIGS. 7A-7B, an ion implantation process 620 is performed through the opening 610 to implant dopant ions into the layer 590. In some embodiments, the implanted dopant ions include boron ions. As a result of the ion implantation process 620, a doped element 630 is formed by the portion of the layer 590 having the dopant ions implanted therein.

Figure 8A:
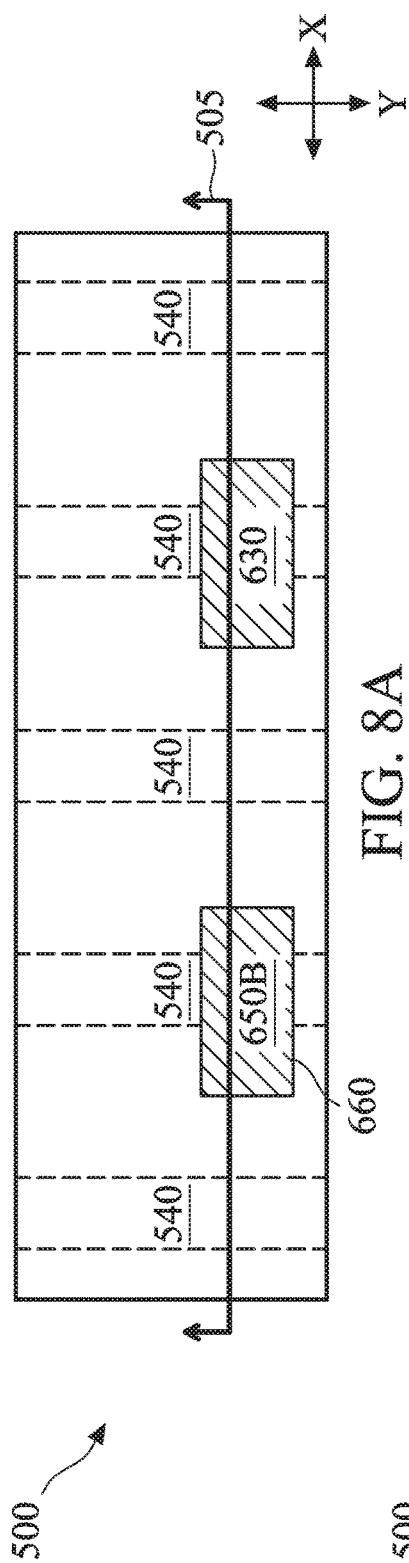
Figure 8B:
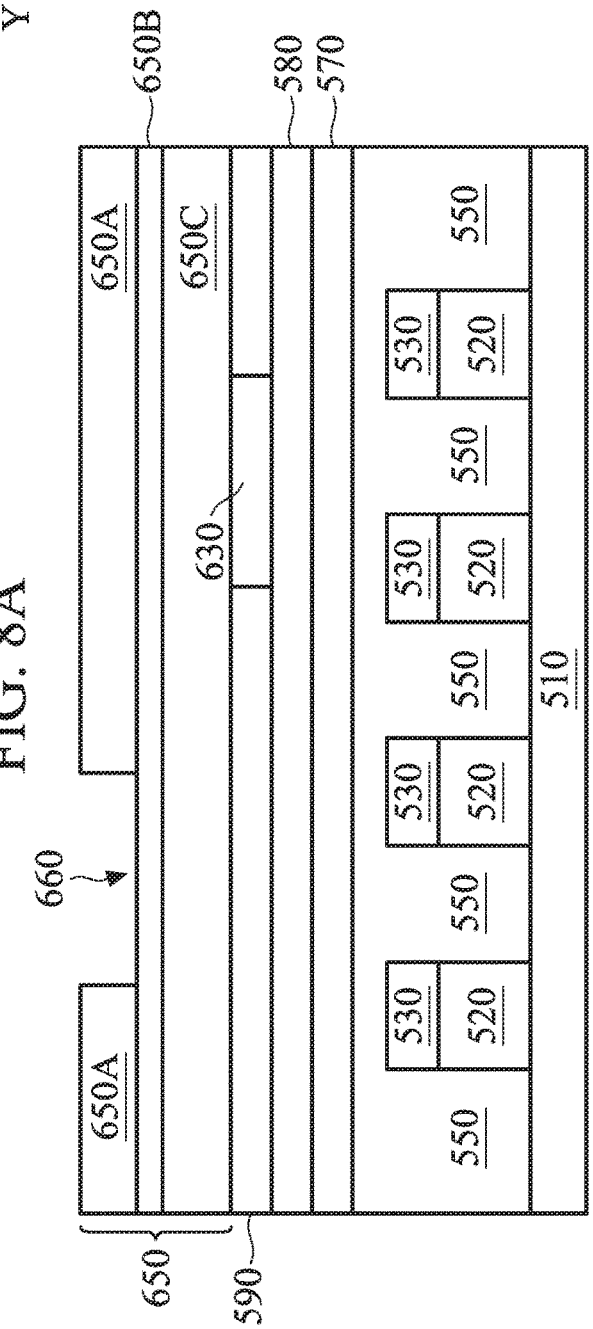

Referring now to FIGS. 8A-8B, the patterned photoresist layer 600 is removed, for example by an ashing or stripping process. Another patterned photoresist layer 650 is formed over the layer 590. Again, the patterned photoresist layer 650 may be a tri-layer photoresist layer and includes a top layer 650A, a middle layer 650B, and a bottom layer 650C. The photoresist layer 650 has been patterned in a manner such that an opening 660 is formed in the top layer 650A. The opening 660 is formed by a different lithography mask than the mask that is used to form the opening 610 discussed above with reference to FIG. 5B. The lithography mask that is used to form the opening 660 is one that does not contain the mask pattern 210 (where the mask pattern 210 corresponds to the opening 610). In the illustrated embodiment, the opening 660 is formed by the lithography mask that contains the mask pattern 231. The opening 660 is patterned using the mask pattern 231. The top view outline of the opening 660 is illustrated in FIG. 8A.

As shown in the cross-sectional view of FIG. 8B, the location of the opening 660 is configured such that it is vertically aligned with one of the contact lines 540. As shown in the top view of FIG. 8A, the size of the opening 610 is also configured to cause a "break" in the contact line 540 with which it is aligned. In more detail, the subsequent processes performed using the opening 610 will cause a blocking component to be formed in the ILD 550, which will prevent the formation of a continuous contact line in the ILD. Instead, the contact lines will be formed as two distinct and separate contacts (e.g., the Vcc contact 139 and the BL contact 140) as a result of the contact-line-blocking components defined by the opening 660. This will become more apparent based on the detailed discussions below.

Similar to the opening 610, the opening 660 may be "stretched" in the X-direction to ensure that the positional shifts or size variations of the opening 660 will not affect its "breaking" of the contact line 540, thereby relaxing the process window and/or increasing the process margin. The "stretched" opening 660 may overlap with the nearby gate stacks 520 in the top view, but this is not a problem since the subsequent processes using the opening 660 will not affect the already-formed gate stacks 520.

Referring now to FIGS. 9A-9B, the opening 660 is extended downwardly into the layers 650B-650C of the patterned photoresist 650. It can be seen in FIG. 9B that the opening 660 now exposes a portion of the layer 590.

Referring now to FIGS. 10A-10B, an ion implantation process 670 is performed through the opening 660 to implant dopant ions into the layer 590. In some embodiments, the implanted dopant ions include boron ions. As a result of the ion implantation process 670, a doped element 680 is formed by the portion of the layer 590 having the dopant ions implanted therein.

Referring now to FIGS. 11A-11B, the patterned photoresist layer 650 is removed, for example by an ashing or stripping process. Another patterned photoresist layer 700 is formed over the layer 590. Again, the patterned photoresist layer 700 may be a tri-layer photoresist layer and includes a top layer 700A, a middle layer 700B, and a bottom layer 700C. The photoresist layer 700 has been patterned in a manner such that an opening 710 is formed in the top layer 700A. The opening 710 is formed by a different lithography mask than the mask that was used to form the opening 610 (FIG. 5B) and the mask that was used to form the opening 660 (FIG. 8B). The lithography mask that is used to form the opening 710 is one that does not contain the mask pattern 210 (where the mask pattern 210 corresponds to the opening 610) and that does not contain the mask pattern 231 (where the mask pattern 231 corresponds to the opening 660). In the illustrated embodiment, the opening 710 is formed by the lithography mask that contains the mask pattern 220. The opening 710 is patterned using the mask pattern 220. The top view outline of the opening 710 is illustrated in FIG. 11A.

It is understood that the opening 710 is not aligned with the openings 610 and 660 and thus is not aligned with the doped elements 630 and 680. This non-alignment is more clearly illustrated in the top view of FIG. 11A, where there is a locational offset between the opening 710 and the doped elements 630 and 680 in the Y-direction. Again, this locational offset (or non-alignment) is consistent with FIGS. 3-4, where the same locational offset (or non-alignment) also exists between the mask patterns 220 (i.e., mask pattern corresponding to the opening 710) and the mask patterns 210 and 231 (i.e., mask patterns corresponding to the doped elements 630 and 680, respectively). As such, if the cross-sectional view of FIG. 11B is taken only at a single cut-line along the X-direction, the opening 710 should not be simultaneously illustrated with the doped elements 630 and 680. However, in order to facilitate the understanding of the present disclosure, the cross-sectional view of FIG. 11B may be considered a composite view (or a superimposed view) of two different cross-sectional views, one of which is taken with a cut-line (along the X-direction) that intersects the doped elements 630 and 680, and the other one of which is taken with a cut-line (along the X-direction but in a different location) that intersects the opening 710. The same is true for the cross-sectional views FIGS. 12B-18B for the following fabrication stages.

As shown in the cross-sectional view of FIG. 11B, the location of the opening 710 is configured such that it is vertically aligned with one of the contact lines 540. As shown in the top view of FIG. 11A, the size of the opening 710 is also configured to cause a "break" in the contact line 540 with which it is aligned. In more detail, the subsequent processes performed using the opening 710 will cause a blocking component to be formed in the ILD 550, which will prevent the formation of a continuous contact line. Instead, the contact lines will be formed as two distinct and separate contacts (e.g., the node contact 135 and the node contact 136) as a result of the contact-line-blocking component defined by the opening 710. This will become more apparent based on the detailed discussions below.

Similar to the opening 610, the opening 710 may be "stretched" in the X-direction to ensure that the positional shifts or size variations of the opening 710 will not affect its "breaking" of the contact line 540, thereby relaxing the process window and/or increasing the process margin. The "stretched" opening 710 may overlap with the nearby gate stacks 520 in the top view, but this is not a problem since the subsequent processes using the opening 710 will not affect the already-formed gate stacks 520.

Figures 12A, 12B:
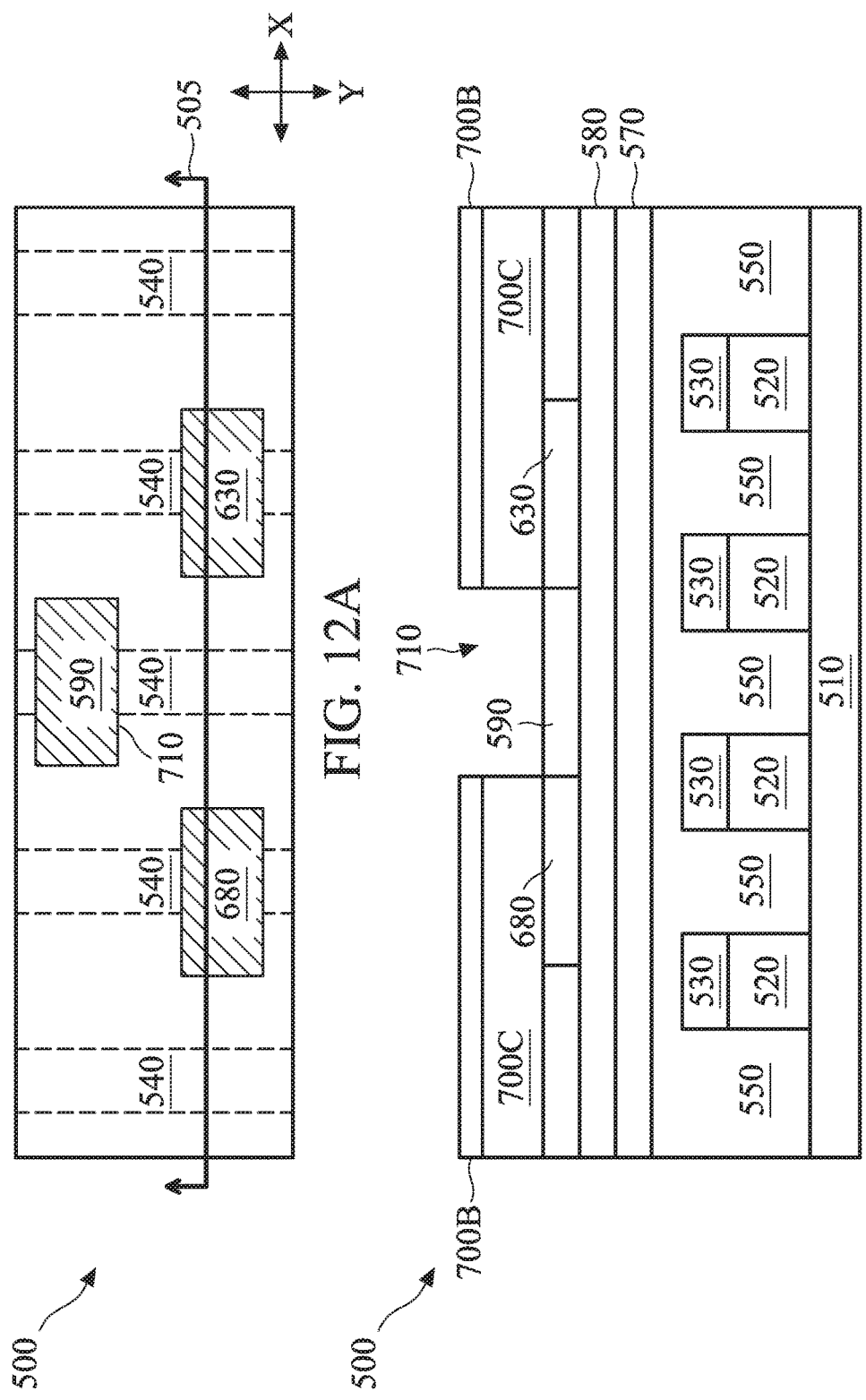

Referring now to FIGS. 12A-12B, the opening 710 is extended downwardly into the layers 700B-700C of the patterned photoresist 700. It can be seen in FIG. 12B that the opening 710 now exposes a portion of the layer 590.

Referring now to FIGS. 13A-13B, an ion implantation process 730 is performed through the opening 710 to implant dopant ions into the layer 590. In some embodiments, the implanted dopant ions include boron ions. As a result of the ion implantation process 730, a doped element 740 is formed by the portion of the layer 590 having the dopant ions implanted therein.

Figure 14A:
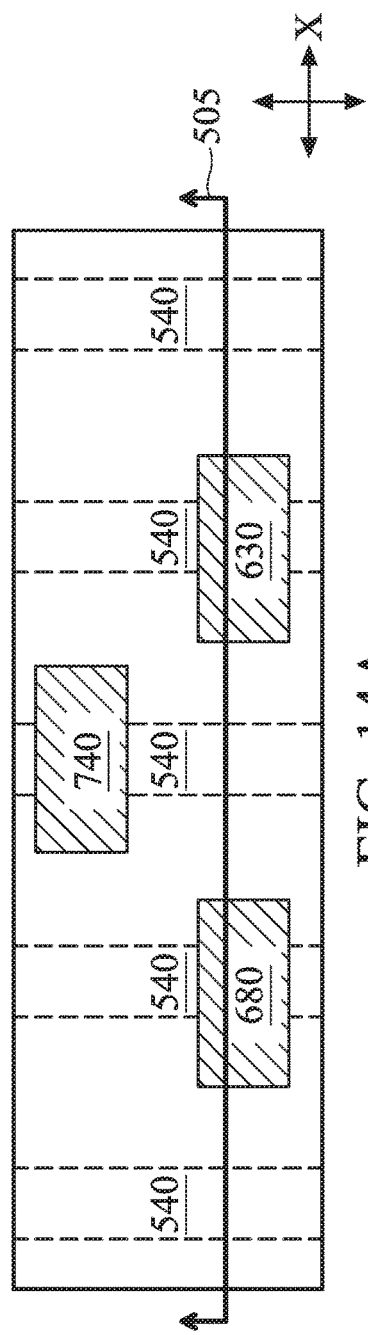
Figure 14B:
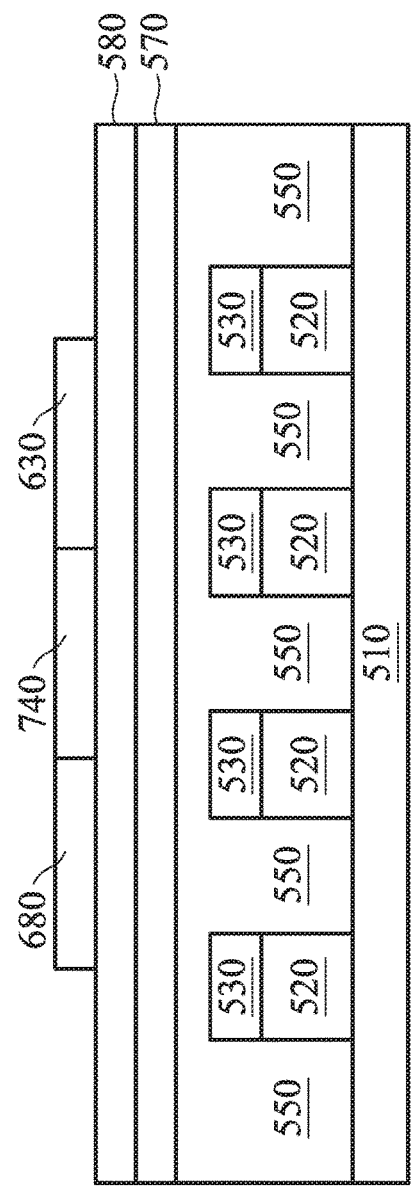

Referring now to FIGS. 14A-14B, the patterned photoresist layer 700 is removed, for example by an ashing or stripping process. As a result, the doped elements 630, 680, and 740 are now exposed. The doped elements 630, 680, 740 will be used to pattern the layers 570-580 therebelow to form contact-line-blocking patterns. These contact-line-blocking patterns will then be used to form the contact-line-blocking components in the ILD 550 to "block" the formation of continuous contact-line trenches (i.e., "breaking up" the trenches), as discussed in more detail below.

Referring now to FIGS. 15A-15B, a patterned photoresist layer 750 is formed over the doped elements 630, 680, and 740. Again, the patterned photoresist layer 750 may be a tri-layer photoresist layer and includes a top layer 750A, a middle layer 750B, and a bottom layer 750C. The photoresist layer 750 has been patterned in a manner such that a plurality of openings such as openings 770, 771, and 772 are formed in the top layer 750A. The openings 770-772 each define the location of a respective contact line, which will be formed as trenches in the ILD 550 in a later step.

Note that in the illustrated embodiment, the definition of the contact-lines involves a double patterning process. For example, as shown in FIGS. 15A-15B, a subset of the contact lines are defined by the openings 770-772, while the rest of the contact lines will be defined later. The double patterning process may help achieve a smaller pitch for the contact lines. It is also understood that the lithography mask used to define the openings 770-772 is a different mask than the three masks discussed above that were used to form the doped elements 630, 680, 740.

Referring now to FIGS. 16A-16B, the openings 770-772 are extended downwardly into the layers 570-580 by performing an etching process 780. The doped elements 630, 680, and 740 also serve as etching masks herein. Note that due to the location of the cutline 505, the doped element 740 should not be directly visible in FIG. 16A. Nevertheless, the outlines of the doped element 740 are still shown as dashed lines herein to help the reader understand the location and position of the doped element 740, and how it will impact the patterning processes discussed below.

As is shown in the top view of FIG. 16A, due to the presence of the doped element 740—which overlaps with the path of the opening 771—the opening 771 is now "broken up" into two segments 771A and 771B. In other words, the doped element 740 prevents portions of the layers 570-580 therebelow from being etched in the etching process 780. As a result, rather than etching the continuous opening 771 into the layers 570-580, two segments 771A-771B of the opening are now etched into the layers 570-580. As such, it may be said that the two segments 771A-771B are "blocked" or "interrupted" by portions of the layers 570-580 under the doped element 740. In the illustrated embodiment, the segments 771A-771B will define the trenches for the node contacts 135-136, respectively. It is understood that the processes discussed above with reference to FIGS. 15A-15B and 16A-16B correspond to a first part of the double patterning process.

Figures 17A, 17B:
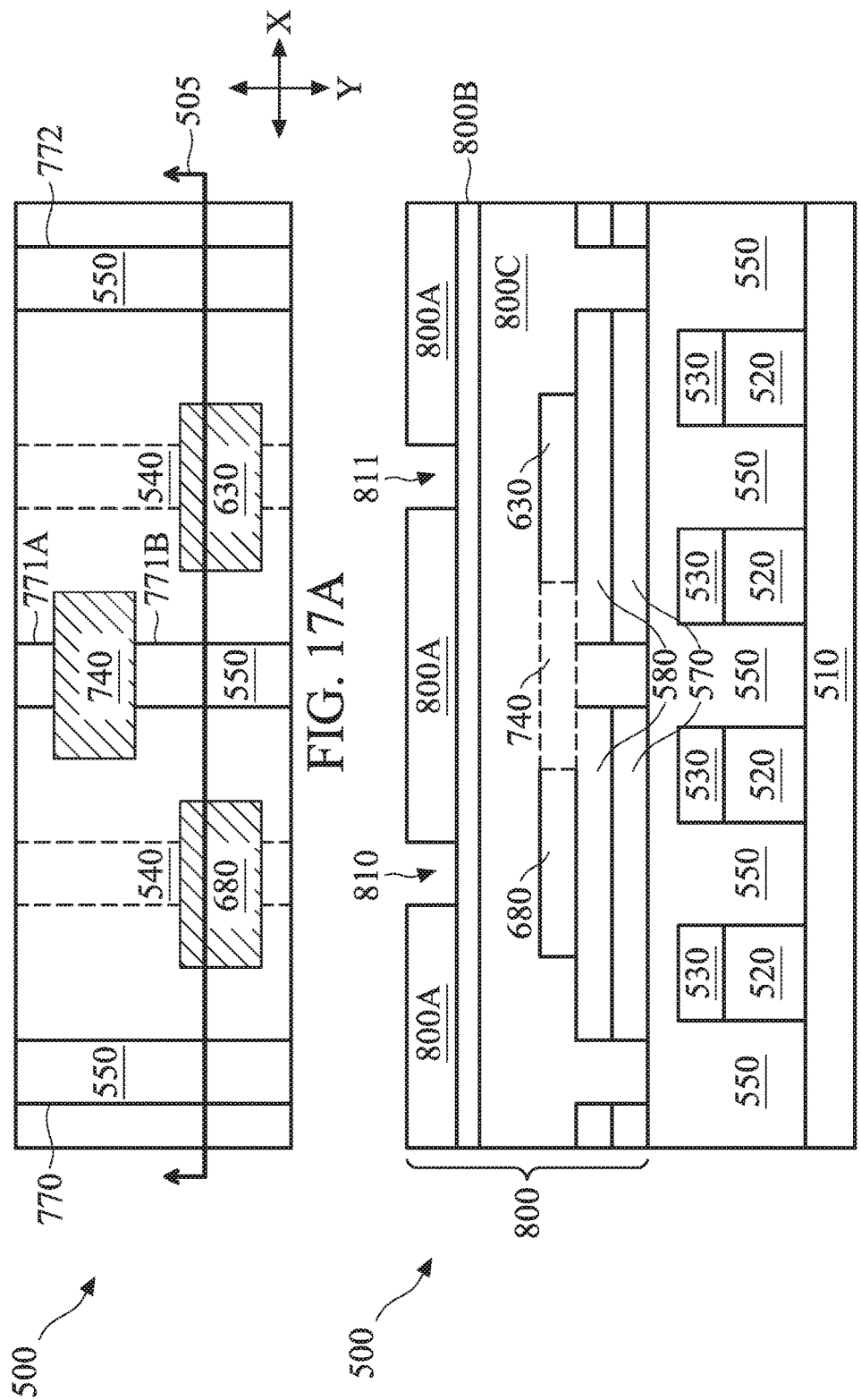

Referring now to FIGS. 17A-17B, a patterned photoresist layer 800 is formed over the doped elements 630, 680, and 740. Again, the patterned photoresist layer 800 may be a tri-layer photoresist layer and includes a top layer 800A, a middle layer 800B, and a bottom layer 800C. The photoresist layer 800 has been patterned in a manner such that a plurality of openings such as openings 810 and 811 are formed in the top layer 800A. The openings 810-811 define the locations of the rest of the contact lines that have not been defined by the openings 770-772 in FIGS. 15A-15B. It is also understood that the lithography mask used to define the openings 810-811 is a different mask than the three masks discussed above that were used to form the doped elements 630, 680, 740.

Referring now to FIGS. 18A-18B, the openings 810-811 are extended downwardly into the layers 570-580 by performing an etching process 830. The doped elements 630, 680, and 740 also serve as etching masks herein. As is shown in the top view of FIG. 18A, due to the presence of the doped elements 630 and 680—which overlap with the paths of the openings 810 and 811, respectively—the opening 810 is now "broken up" into two segments 810A and 810B, and the opening 811 is now "broken up" into two segments 811A and 811B. In other words, the doped elements 630 and 680 prevent portions of the layers 570-580 therebelow from being etched in the etching process 830. As a result, rather than etching the continuous openings 810-811 into the layers 570-580, segments 810A-810B and 811A-811B of the openings are now etched into the layers 570-580. As such, it may be said that the two segments 810A-810B are "blocked" or "interrupted" by portions of the layers 570-580 protected by the doped element 680, and the two segments 811A-811B are "blocked" or "interrupted" by portions of the layers 570-580 protected by the doped element 630.

In the illustrated embodiment, the segments 810A-810B will define the trenches for the Vcc contact 139 and the bit-line contact 140 (of FIG. 4), respectively, and the segments 811A-811B will define the trenches for the Vcc contact 132 and the Vss contact 133, respectively. It is understood that the processes discussed above with reference to FIGS. 17A-17B and 18A-18B correspond to a second part of the double patterning process.

Figure 19A:
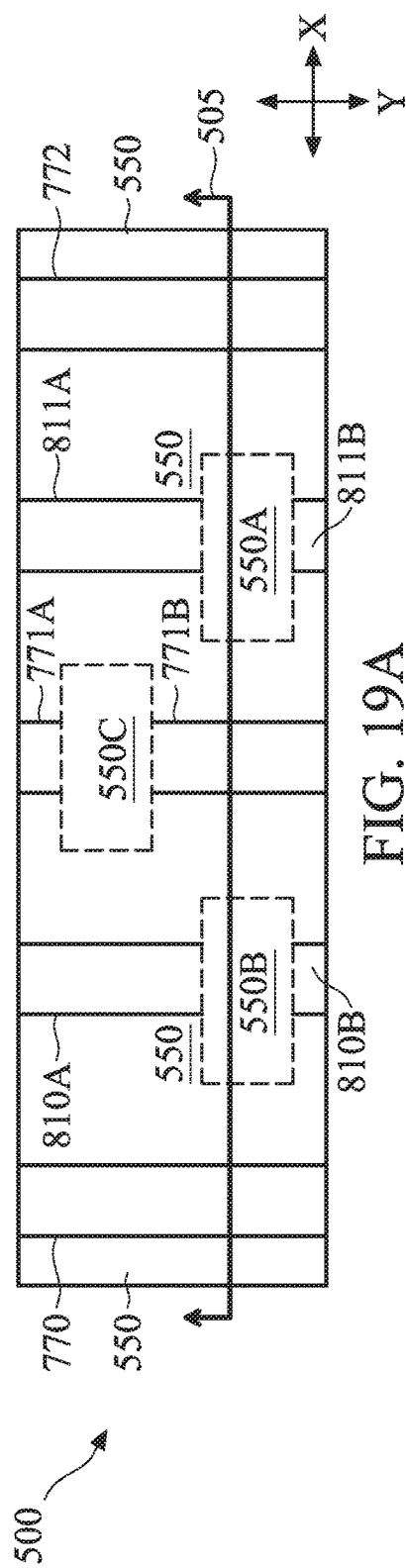
Figure 19B:
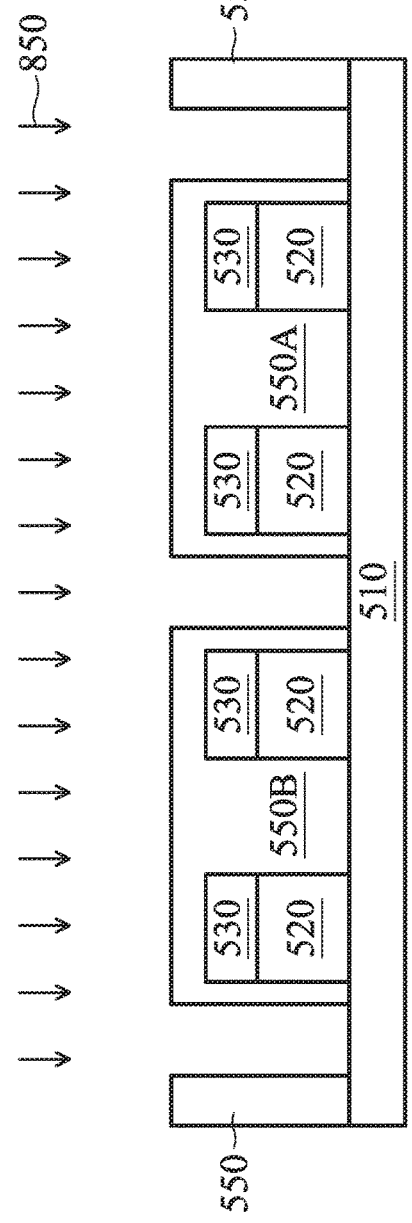

It is also understood that at this stage of fabrication, the trench patterns for all the SRAM contact lines have been defined in the layers 570-580, even if they are not all visible in the cross-sectional view of FIG. 19B due to the location of the X-directional crosscut at cutline 505. The layers 570-580 serve as hard mask layers herein, and the openings formed in the hard mask layer 570-580 which will define the actual trenches in the ILD 550 in order to form the SRAM contact lines in the subsequent processes.

Referring now to FIGS. 19A-19B, one or more etching processes 850 are performed to etch the openings 770, 771A-771B, 772, 810A-810B, and 811A-811B into the ILD 550. The openings 770, 771A-771B, 772, 810A-810B, and 811A-811B etched into the ILD 550 form contact line trenches. The hard mask layers 570-580 may be used as etching masks in the etching processes 850 and are removed after the openings are etched into the ILD 550. It can be seen in the top view of FIG. 19A that portions of the ILD layer 550A, 550B, 550C correspond to the doped elements 630, 680, 740, respectively. It may be said that these portions of the ILD layer 550A, 550B, 550C are defined by the three lithography masks that contained the mask patterns that defined the doped elements 630, 680, and 740, respectively. The portions of the ILD layer 550A, 550B, 550C serve as contact-line-blocking components, since they effectively "break up" the contact line trenches into trench segments 810A-810B, 771A-771B, and 811A-811B, as shown in FIG. 19A.

Referring now to FIGS. 20A-20B, a deposition process 900 may be performed to fill a conductive material in the contact line trenches 770, 772, 810A-810B, 771A-771B, and 811A-811B. In some embodiments, the conductive material may include a metal such as tungsten, copper, aluminum, or combinations thereof. As a result, SRAM contacts 910A-910B, 911A-911B, 970, 971A, 971B, and 972 are formed. In the illustrated embodiment, the contacts 910A and 910B correspond to the Vcc contact 139 and the bit-line contact 140, the contacts 911A and 911B correspond to the Vcc contact 132 and the Vss contact 133, and the contacts 971A and 971B correspond to the node contact 135 and the node contact 136. Again, as shown in FIGS. 20A-20B, the ILD portions 550A, 550B, and 550C "break up" the contact lines into the contacts 911A-911B, 910A-910B, and 971A-971B, respectively.

It may also be said that the ILD portions 550A, 550B, and 550C effectively define the boundaries or borders of the contacts 911A-911B, 910A-910B, and 971A-971B. For example, since the ILD portion 550A is disposed between the contacts 911A-911B, it defines a boundary of the contact 911A and a boundary of the contact 911B. Since the ILD portion 550B is disposed between the contacts 910A-910B, it defines a boundary of the contact 910A and a boundary of the contact 910B. Since the ILD portion 550C is disposed between the contacts 971A-971B, it defines a boundary of the contact 971A and a boundary of the contact 971B. As discussed above, by splitting the contact-line-blocking mask patterns (discussed above with reference to FIGS. 3-4) to three or more lithography masks, the present disclosure reduces bridging risks between the contacts 911A-911B, 910A-910B, and 971A-971B and relaxes the process margins. In addition, contact-to-fin landing performance for these contacts 911A-911B, 910A-910B, and 971A-971B is also improved.

Figure 21:
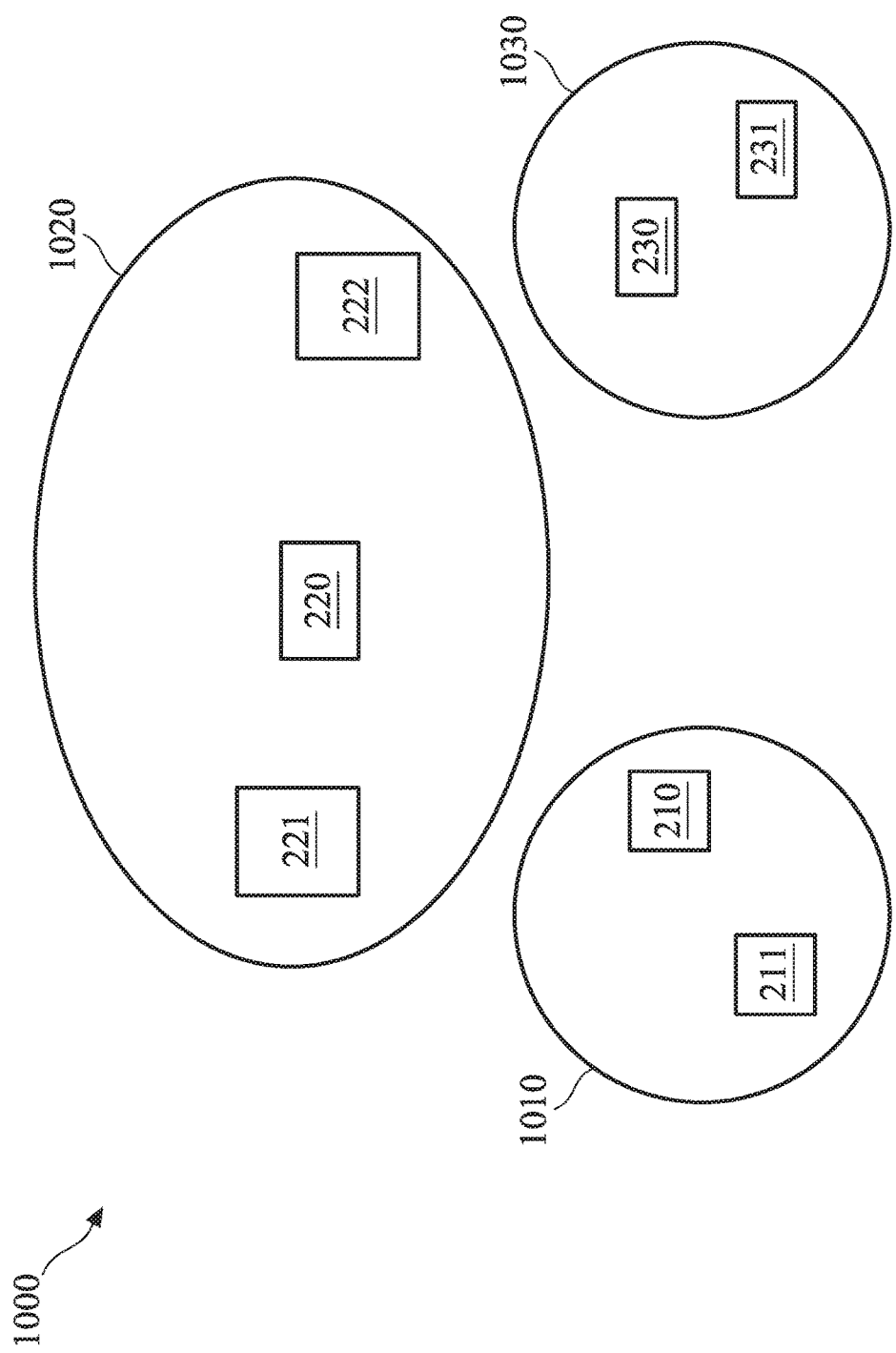
FIG. 21 illustrates a lithography system that includes multiple lithography masks according to an embodiment of the present disclosure.

FIG. 21 illustrates a lithography system 1000. The lithography system 1000 includes at least three lithography masks 1010, 1020, and 1030, according to the various aspects of the present disclosure. According to one embodiment of the present disclosure, the lithography mask 1010 includes the mask patterns 210-211 discussed above with reference to FIGS. 3-4, the lithography mask 1020 includes the mask patterns 220-222 discussed above with reference to FIGS. 3-4, and the lithography mask 1030 includes the mask patterns 230-231 discussed above with reference to FIGS. 3-4.

Since the mask patterns 210-211, 220-222, and 230-231 are implemented on three separate lithography masks 1010, 1020, 1030, respectively, there is greater freedom in tuning the mask patterns on each lithography mask. As discussed above, the greater tuning freedom allows the mask patterns to be more flexibly adjusted (e.g., stretched) without risking bridging with other mask patterns or otherwise interfering with their intended patterning functionalities. In addition, each lithography mask may have a better mask pattern uniformity, which also improves the lithography performance. The mask patterns 210-211, 220-222, and 230-231 are also each implemented as a rectangle. The rectangular nature of the mask patterns 210-211, 220-222, and 230-231 lead to better patterning performance, as the rectangular geometry of the patterns is less likely to cause breakage, as opposed to wiggly patterns, zig-zag patterns, or other irregularly-shaped patterns.

Figure 22:
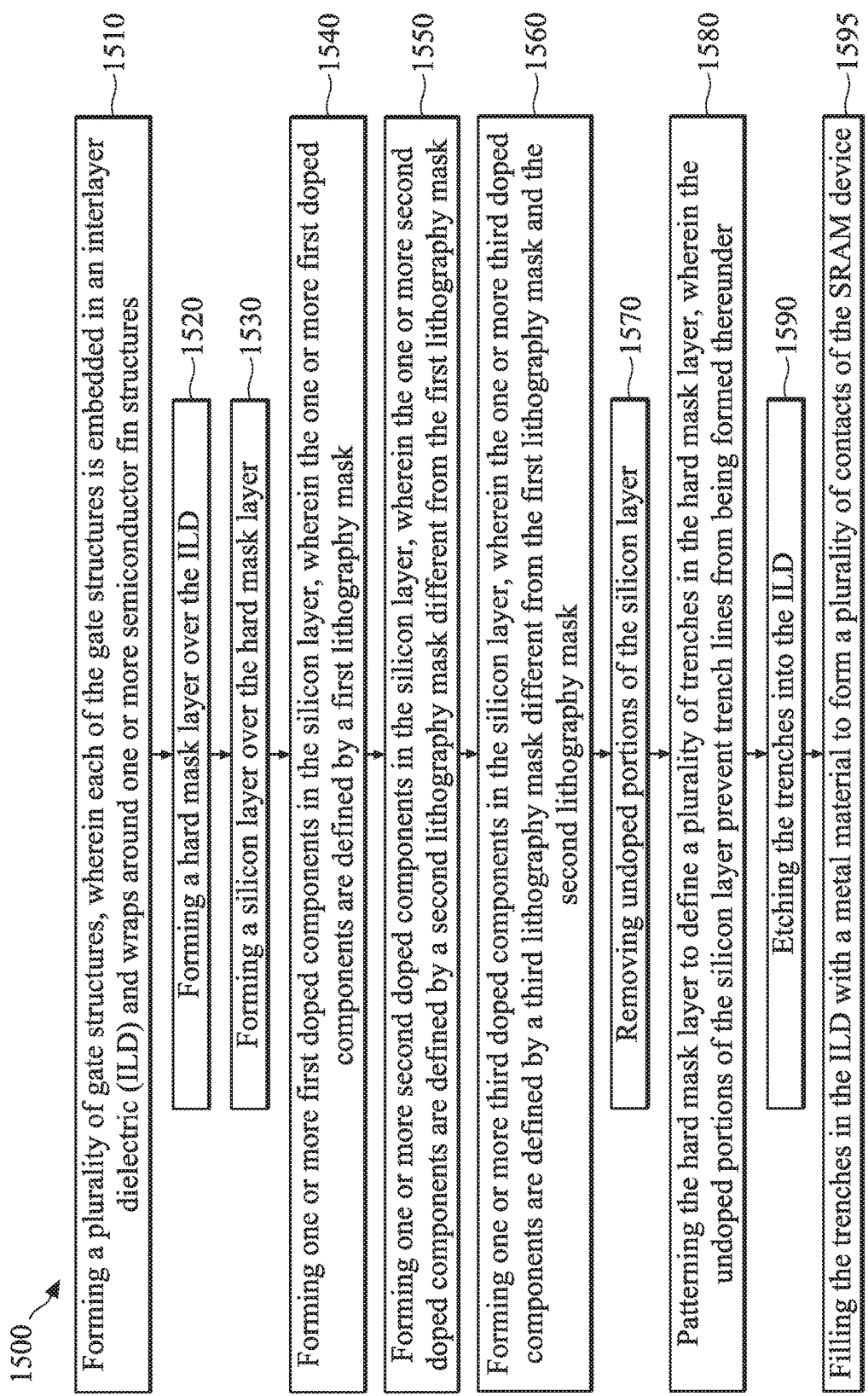
FIG. 22 is a flowchart illustrating a method according to an embodiment of the present disclosure.

FIG. 22 is a flowchart illustrating a method 1500 of fabricating a static random access memory (SRAM) device.

The method 1500 includes a step 1510 of forming a plurality of gate structures. Each of the gate structures is embedded in an interlayer dielectric (ILD) and wraps around one or more semiconductor fin structures.

The method 1500 includes a step 1520 of forming a hard mask layer over the ILD.

The method 1500 includes a step 1530 of forming a silicon layer over the hard mask layer.

The method 1500 includes a step 1540 of forming one or more first doped components in the silicon layer. The one or more first doped components are defined by a first lithography mask.

The method 1500 includes a step 1550 of forming one or more second doped components in the silicon layer. The one or more second doped components are defined by a second lithography mask different from the first lithography mask.

The method 1500 includes a step 1560 of forming one or more third doped components in the silicon layer. The one or more third doped components are defined by a third lithography mask different from the first lithography mask and the second lithography mask.

The method 1500 includes a step 1570 of removing undoped portions of the silicon layer.

The method 1500 includes a step 1580 of patterning the hard mask layer to define a plurality of trenches in the hard mask layer. The one or more first, second, and third components in the silicon layer prevent trench lines from being formed thereunder.

The method 1500 includes a step 1590 of etching the trenches into the ILD.

The method 1500 includes a step 1595 of filling the trenches in the ILD with a metal material to form a plurality of contacts of the SRAM device.

In some embodiments, the patterning comprises defining at least a first discontinuous trench, a second discontinuous trench, and a third discontinuous trench for each SRAM cell of the SRAM device. In some embodiments, the first discontinuous trench includes trench segments that, after being etched into the ILD and filled with the metal material, form a bit-line contact, a Vcc contact, and a Vss contact. In some embodiments, the second discontinuous trench includes trench segments that, after being etched into the ILD and filled with the metal material, form a first node contact and a second node contact. In some embodiments, the third discontinuous trench includes trench segments that, after being etched into the ILD and filled with the metal material, form a Vss contact, a Vcc contact, and a bit-line contact.

In some embodiments, the one or more first doped components, the one or more second doped components, and the one or more third doped components are each by rectangular mask patterns on the first lithography mask, the second lithography mask, and the third lithography mask, respectively.

In some embodiments, the etching the trenches into the ILD comprises a double patterning process.

In some embodiments, the forming the one or more first doped components comprises using the first lithography mask to form one or more first openings in a first photoresist layer and implanting ions through the one or more first openings into the silicon layer.

In some embodiments, the forming the one or more second doped components comprises using the second lithography mask to form one or more second openings in a second photoresist layer and implanting ions through the one or more second openings into the silicon layer.

In some embodiments, the forming the one or more third doped components comprises using the third lithography mask to form one or more third openings in a third photoresist layer and implanting ions through the one or more third openings into the silicon layer.

It is understood that additional processes may be performed before, during, or after the steps 1510-1595 of the method 1500. For reasons of simplicity, other additional steps are not discussed herein in detail.

Figure 23:
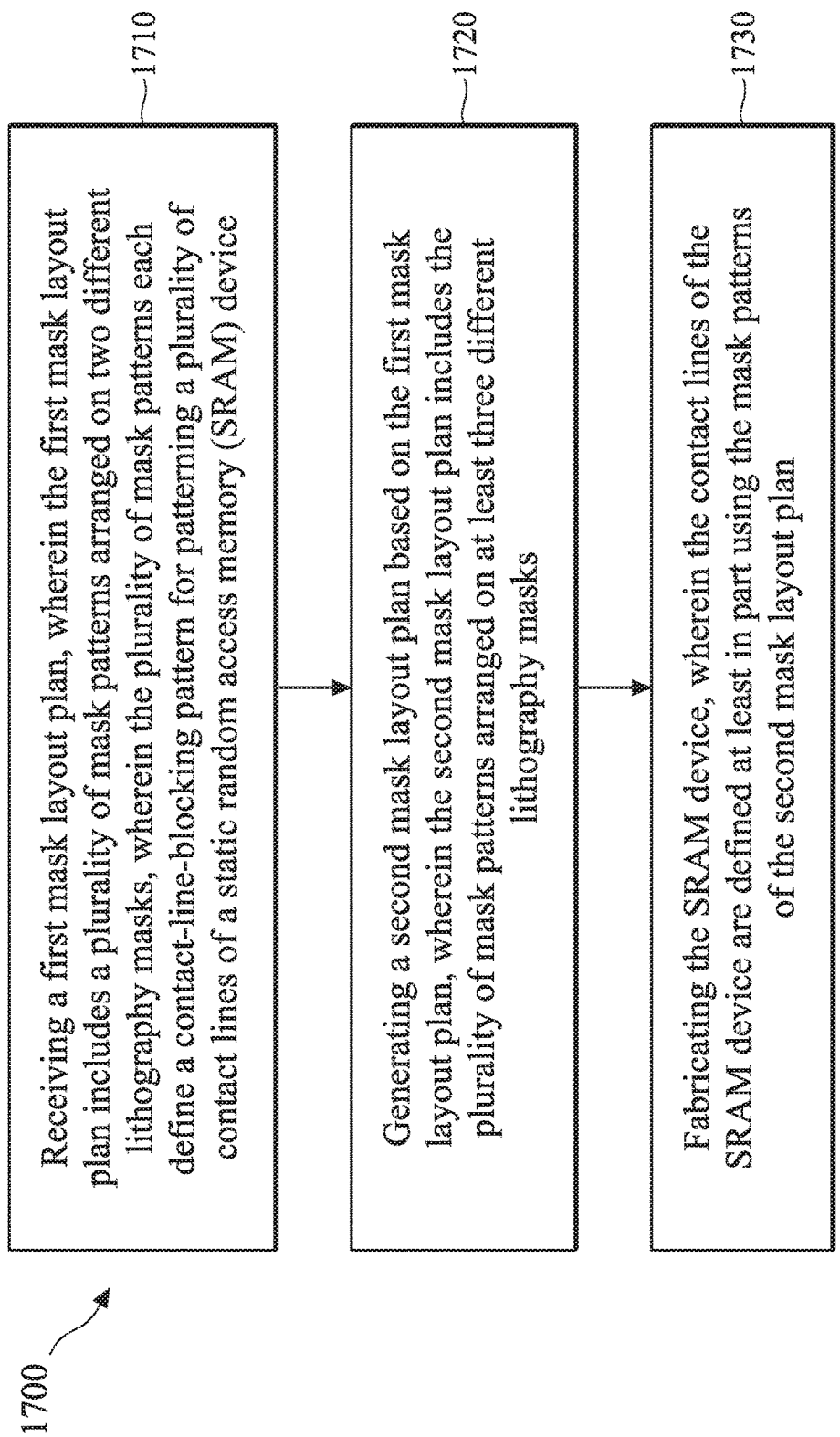
FIG. 23 is a flowchart illustrating a method according to an embodiment of the present disclosure.

FIG. 23 is a flowchart illustrating a method 1700 of fabricating a static random access memory (SRAM) device.

The method 1700 includes a step 1710 of receiving a first mask layout plan. The first mask layout plan includes a plurality of mask patterns arranged on two different lithography masks. The plurality of mask patterns each define a contact-line-blocking pattern for patterning a plurality of contact lines of a static random access memory (SRAM) device.

The method 1700 includes a step 1720 of generating a second mask layout plan based on the first mask layout plan. The second mask layout plan includes the plurality of mask patterns arranged on at least three different lithography masks.

The method 1700 includes a step 1730 of fabricating the SRAM device. The contact lines of the SRAM device are defined at least in part using the mask patterns of the second mask layout plan. In some embodiments, the fabricating the SRAM device comprises: etching a plurality of trenches in a dielectric layer. At least some of the trenches are interrupted by portions of the dielectric layer that are defined by the mask patterns of the second mask layout plan. In some embodiments, the fabricating the SRAM device comprises: filling the trenches to form the contact lines of the SRAM device.

In some embodiments, the contact lines each extend in a first direction, and the generating comprises enlarging at least one of the mask patterns in a second direction perpendicular to the first direction.

It is understood that additional processes may be performed before, during, or after the steps 1710-1730 of the method 1700. For reasons of simplicity, other additional steps are not discussed herein in detail.

Based on the above discussions, it can be seen that the present disclosure offers advantages over conventional fabrication of FinFET SRAM devices. It is understood, however, that other embodiments may offer additional advantages, and not all advantages are necessarily disclosed herein, and that no particular advantage is required for all embodiments. One advantage is that the present disclosure reduces the contact bridging risks. By splitting the contact-line-blocking mask patterns onto three or more lithography masks, there is now a greater degree of freedom in tuning the mask patterns on each lithography mask. For example, some patterns may be stretched or enlarged in a predefined direction so as to maximize the likelihood of breaking up the SRAM contacts in a subsequent fabrication process. Another advantage is that the three or more lithography masks may each have improved pattern uniformity, as the mask patterns may each be shaped as a rectangle and/or may have similar dimensions to one another. The improved pattern uniformity in turns leads to improved lithography performance. Other advantages include compatibility with existing FinFET SRAM design and manufacture, so implementation of the present disclosure is easy and cheap.

One aspect of the present disclosure pertains to a method of fabricating a static random access memory (SRAM) device. The method comprises: forming a plurality of gate stacks over a substrate, wherein the gate stacks are surrounded by a dielectric structure; forming a plurality of contact-line-blocking patterns over the dielectric structure, wherein the contact-line-blocking patterns are formed using three or more lithography masks; forming a plurality of trenches in the dielectric structure, wherein the contact-line-blocking patterns serve as protective masks for the dielectric structure to prevent trenches from being formed in portions of the dielectric structure underneath the contact-line-blocking patterns; and filling the trenches with a conductive material to form a plurality of contact lines of the SRAM device. In some embodiments, the forming of the contact-line-blocking patterns comprises: forming a first contact-line-blocking pattern using a first lithography mask that includes a first mask pattern; forming a second contact-line-blocking pattern using a second lithography mask that includes a second mask pattern; and forming a third contact-line-blocking pattern using a third lithography mask that includes a third mask pattern. In some embodiments, the forming the plurality of trenches comprises etching a first trench for a first Vcc contact and a second trench for a first Vss contact, and wherein a portion of the dielectric structure disposed below the first contact-line-blocking pattern and between the first trench and the second trench is unetched. In some embodiments, the forming the plurality of trenches comprises etching a third trench for a second Vcc contact and a fourth trench for a first bit-line contact, and wherein a portion of the dielectric structure disposed below the second contact-line-blocking pattern and between the third trench and the fourth trench is unetched. In some embodiments, the forming the plurality of trenches comprises etching a fifth trench for a first node contact and a sixth trench for a second node contact, and wherein a portion of the dielectric structure disposed below the third contact-line-blocking pattern and between the fifth trench and the sixth trench is unetched. In some embodiments, the method further comprises: forming a plurality of fin structures over the substrate, and wherein the gate stacks are formed to each wrap around one of the fin structures. In some embodiments, the forming the plurality of contact-line-blocking patterns comprises: implanting dopants into a plurality of portion of a silicon layer formed over the dielectric structure, thereby forming a plurality of doped portions of the silicon layer, wherein each of the doped portions is defined using a respective one of the three or more lithography masks. In some embodiments, each of the contact-line-blocking patterns is defined by a respective rectangular mask pattern.

One aspect of the present disclosure pertains to a method of fabricating a static random access memory (SRAM) device. The method comprises: forming a plurality of gate structures, wherein each of the gate structures is embedded in an interlayer dielectric (ILD) and wraps around one or more semiconductor fin structures; forming a hard mask layer over the ILD; forming a silicon layer over the hard mask layer; forming one or more first doped components in the silicon layer, wherein the one or more first doped components are defined by a first lithography mask; forming one or more second doped components in the silicon layer, wherein the one or more second doped components are defined by a second lithography mask different from the first lithography mask; forming one or more third doped components in the silicon layer, wherein the one or more third doped components are defined by a third lithography mask different from the first lithography mask and the second lithography mask; removing undoped portions of the silicon layer; patterning the hard mask layer to define a plurality of trenches in the hard mask layer, wherein the one or more first, second, and third doped components in the silicon layer prevent trench lines from being formed thereunder; etching the trenches into the ILD; and filling the trenches in the ILD with a metal material to form a plurality of contacts of the SRAM device. In some embodiments, the patterning comprising defining at least a first discontinuous trench, a second discontinuous trench, and a third discontinuous trench for each SRAM cell of the SRAM device. In some embodiments, the first discontinuous trench includes trench segments that, after being etched into the ILD and filled with the metal material, form a bit-line contact, a Vcc contact, and a Vss contact. In some embodiments, the second discontinuous trench includes trench segments that, after being etched into the ILD and filled with the metal material, form a first node contact and a second node contact; and the third discontinuous trench includes trench segments that, after being etched into the ILD and filled with the metal material, form a Vss contact, a Vcc contact, and a bit-line contact.

One aspect of the present disclosure pertains to a system. The system includes at least three lithography masks that are different from one another, wherein each of the three lithography masks include one or more respective mask patterns, and wherein each of the mask patterns is configured to define a respective contact-line-blocking pattern, and wherein the contact-line-blocking pattern is configured to pattern a plurality of contact lines of a static random access memory (SRAM) device. In some embodiments, the at least three lithography masks includes: a first lithography mask that includes a first pattern and a second pattern; a second lithography mask that includes a third pattern, a fourth pattern, and a fifth pattern; and a third lithography mask that includes a sixth pattern and a seventh pattern. In some embodiments, the first pattern is configured to define a first contact-line-blocking pattern that partially defines borders for a first Vcc contact and a first Vss contact; and the second pattern is configured to define a second contact-line-blocking pattern that partially defines borders for a second Vcc contact and a first Vss contact. In some embodiments, the third pattern is configured to define a third contact-line-blocking pattern that partially defines borders for a first node contact and a second node contact; the fourth pattern is configured to define a fourth contact-line-blocking pattern that partially defines borders for a first bit-line contact and the first node contact; and the fifth pattern is configured to define a fifth contact-line-blocking pattern that partially defines borders for a second bit-line contact and the second node contact. In some embodiments, the sixth pattern is configured to define a sixth contact-line-blocking pattern that partially defines borders for a first Vcc contact and a first bit-line contact; and the seventh pattern is configured to define a seventh contact-line-blocking pattern that partially defines borders for a second Vcc contact and a second bit-line contact. In some embodiments, the contact lines each extend in a first direction; the first pattern has first dimension measured in a second direction perpendicular to the second direction; the sixth pattern has second dimension measured in the second direction; and the first dimension is greater than the second dimension. In some embodiments, the contact lines each extend in a first direction; the SRAM device has a pitch measured in a second direction perpendicular to the first direction; and a dimension of the fourth pattern measured in the second direction is greater than ½ of the pitch of the SRAM device. In some embodiments, each of the first pattern, second pattern, third pattern, fourth pattern, fifth pattern, sixth pattern, and seventh pattern is shaped as a rectangle.

One aspect of the present disclosure pertains to a system. The system includes: a first lithography mask that includes one or more first mask patterns, wherein the one or more first mask patterns are configured to break up at least a first contact line of a static random access memory (SRAM) device; a second lithography mask that includes one or more second mask patterns, wherein the one or more second mask patterns are configured to break up at least a second contact line of the SRAM device; and a third lithography mask that includes one or more third mask patterns, wherein the one or more third mask patterns are configured to break up at least a third contact line of the SRAM device.

One aspect of the present disclosure pertains to a system. The system includes: a first lithography mask that includes one or more first mask patterns, wherein the one or more first mask patterns are configured to define boundaries of a first subset of contact lines of a static random access memory (SRAM) device; a second lithography mask that includes one or more second mask patterns, wherein the one or more second mask patterns are configured to define boundaries of a second subset of contact lines of the SRAM device; and a third lithography mask that includes one or more third mask patterns, wherein the one or more third mask patterns are configured to define boundaries of a third subset of contact lines of the SRAM device.

One aspect of the present disclosure pertains to a method. The method includes: receiving a first mask layout plan, wherein the first mask layout plan includes a plurality of mask patterns arranged on two different lithography masks, wherein the plurality of mask patterns each define a contact-line-blocking pattern for patterning a plurality of contact lines of a static random access memory (SRAM) device; and generating a second mask layout plan based on the first mask layout plan, wherein the second mask layout plan includes the plurality of mask patterns arranged on at least three different lithography masks. In some embodiments, the contact lines each extend in a first direction; and the generating comprises enlarging at least one of the mask patterns in a second direction perpendicular to the first direction. In some embodiments, the method further includes: fabricating the SRAM device, wherein the contact lines of the SRAM device are defined at least in part using the mask patterns of the second mask layout plan. In some embodiments, the fabricating the SRAM device comprises: etching a plurality of trenches in a dielectric layer, wherein at least some of the trenches are interrupted by portions of the dielectric layer that are defined by the mask patterns of the second mask layout plan; and filling the trenches to form the contact lines of the SRAM device.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, by implementing different thicknesses for the bit line conductor and word line conductor, one can achieve different resistances for the conductors. However, other techniques to vary the resistances of the metal conductors may also be utilized as well.

What is claimed is:

1. A method of fabricating a static random access memory (SRAM) device, comprising:
   forming a plurality of fin structures over a substrate;
   forming a plurality of gate stacks over the substrate, wherein side surfaces of the gate stacks are surrounded by a dielectric structure, and wherein the gate stacks are formed to each wrap around a top surface and side surfaces of the fin structures;
   forming a plurality of contact-line-blocking patterns over the dielectric structure, wherein the contact-line-blocking patterns are formed using three or more lithography masks;
   forming a plurality of trenches in the dielectric structure, wherein the contact-line-blocking patterns serve as protective masks for the dielectric structure to prevent trenches from being formed in portions of the dielectric structure underneath the contact-line-blocking patterns; and
   filling the trenches with a conductive material to form a plurality of contact lines of the SRAM device.

2. The method of claim 1, wherein the forming of the contact-line-blocking patterns comprises:
   forming a first contact-line-blocking pattern using a first lithography mask that includes a first mask pattern;
   forming a second contact-line-blocking pattern using a second lithography mask that includes a second mask pattern; and
   forming a third contact-line-blocking pattern using a third lithography mask that includes a third mask pattern.

3. The method of claim 2, wherein the forming the plurality of trenches comprises etching a first trench for a first Vcc contact and a second trench for a first Vss contact, and wherein a portion of the dielectric structure disposed below the first contact-line-blocking pattern and between the first trench and the second trench is unetched.

4. The method of claim 2, wherein the forming the plurality of trenches comprises etching a third trench for a second Vcc contact and a fourth trench for a first bit-line contact, and wherein a portion of the dielectric structure disposed below the second contact-line-blocking pattern and between the third trench and the fourth trench is unetched.

5. The method of claim 2, wherein the forming the plurality of trenches comprises etching a fifth trench for a first node contact and a sixth trench for a second node contact, and wherein a portion of the dielectric structure disposed below the third contact-line-blocking pattern and between the fifth trench and the sixth trench is unetched.

6. The method of claim 1, wherein the forming the plurality of contact-line-blocking patterns comprises: implanting dopants into a plurality of portion of a silicon layer formed over the dielectric structure, thereby forming a plurality of doped portions of the silicon layer, wherein each of the doped portions is defined using a respective one of the three or more lithography masks.

7. The method of claim 1, wherein each of the contact-line-blocking patterns is defined by a respective rectangular mask pattern.

8. The method of claim 1, wherein:
   the gate stacks are formed over the substrate in a vertical direction; and
   side surfaces of the gate stacks are surrounded in a horizontal direction by the dielectric structure.

9. A method of fabricating a static random access memory (SRAM) device, comprising:
   forming a plurality of gate structures, wherein each of the gate structures is embedded in an interlayer dielectric (ILD) and wraps around one or more semiconductor fin structures;
   forming a hard mask layer over the ILD;
   forming a silicon layer over the hard mask layer;
   forming one or more first doped components in the silicon layer, wherein the one or more first doped components are defined by a first lithography mask;
   forming one or more second doped components in the silicon layer, wherein the one or more second doped components are defined by a second lithography mask different from the first lithography mask;
   forming one or more third doped components in the silicon layer, wherein the one or more third doped components are defined by a third lithography mask different from the first lithography mask and the second lithography mask;
   removing undoped portions of the silicon layer;
   patterning the hard mask layer to define a plurality of trenches in the hard mask layer, wherein the one or more first, second, and third doped components in the silicon layer prevent trench lines from being formed thereunder;
   etching the trenches into the ILD; and
   filling the trenches in the ILD with a metal material to form a plurality of contacts of the SRAM device.

10. The method of claim 9, wherein the patterning comprising defining at least a first discontinuous trench, a second discontinuous trench, and a third discontinuous trench for each SRAM cell of the SRAM device.

11. The method of claim 10, wherein the first discontinuous trench includes trench segments that, after being etched into the ILD and filled with the metal material, form a bit-line contact, a Vcc contact, and a Vss contact.

12. The method of claim 11, wherein:
   the second discontinuous trench includes trench segments that, after being etched into the ILD and filled with the metal material, form a first node contact and a second node contact; and
   the third discontinuous trench includes trench segments that, after being etched into the ILD and filled with the metal material, form a Vss contact, a Vcc contact, and a bit-line contact.

13. A method of fabricating a static random access memory (SRAM) device, comprising:
   forming a plurality of gate structures a substrate, wherein the gate structures are surrounded by an interlayer dielectric (ILD);
   forming a layer over the gate structures and over the ILD;
   forming a plurality of blocking patterns by doping different portions of the layer;
   etching a plurality of trenches in the ILD, wherein the blocking patterns prevent portions of the ILD underneath from being etched; and
   filling the trenches with a conductive material.

14. The method of claim 13, wherein the forming the layer comprises forming a silicon layer over the ILD.

15. The method of claim 14, wherein the forming the blocking patterns comprises doping different portions of the silicon layer with boron, wherein the different portions are separated from one another in a top view.

16. The method of claim 13, wherein the forming the blocking patterns comprises using a plurality of lithography masks.

17. The method of claim 13, wherein:
the trenches each extend in a first direction in a top view; and
the blocking patterns each extend in a second direction different from the first direction in a top view.

18. The method of claim 13, wherein:
the etching comprises etching a Vcc contact trench and a Vss contact trench of the SRAM device; and
one of the blocking patterns is located between the Vcc contact trench and the Vss contact trench in a top view.

19. The method of claim 13, wherein:
the etching comprises etching a Vcc contact trench and a bit-line contact trench of the SRAM device; and
one of the blocking patterns is located between the Vcc contact trench and the bit-line contact trench in a top view.

20. The method of claim 13, wherein:
the etching comprises etching a first node contact trench and a second node contact trench of the SRAM device; and
one of the blocking patterns is located between the first node contact trench and the second node contact trench in a top view.

* * * * *